United States Patent [19]
Ikeda

[11] Patent Number: 5,717,706
[45] Date of Patent: Feb. 10, 1998

[54] APPARATUS AND METHOD FOR DETECTING SIGNAL POINTS USING SIGNAL POINT-MAPPING

[75] Inventor: Tamotsu Ikeda, Tokyo, Japan

[73] Assignee: Sony Corporation, Tokyo, Japan

[21] Appl. No.: 394,507

[22] Filed: Feb. 27, 1995

[30] Foreign Application Priority Data

Mar. 4, 1994 [JP] Japan .................. 6-034328

[51] Int. Cl.$^6$ .................................................. G06F 11/10
[52] U.S. Cl. .................. 371/43; 375/261; 375/265
[58] Field of Search ................. 371/43–45, 37.1; 375/261–265, 295, 281, 237, 259, 238, 280, 286, 239, 294, 271

[56] References Cited

U.S. PATENT DOCUMENTS

| | | | |
|---|---|---|---|
| 5,289,501 | 2/1994 | Seshadri et al. .................. | 375/34 |
| 5,418,798 | 5/1995 | Wei .................. | 371/43 |
| 5,521,942 | 5/1996 | Betts et al. .................. | 371/43 |
| 5,548,615 | 8/1996 | Wei .................. | 375/281 |

*Primary Examiner*—Reba I. Elmore
*Assistant Examiner*—Thomas E. Brown
*Attorney, Agent, or Firm*—William S. Frommer; Alvin Sinderbrand

[57] ABSTRACT

An apparatus and method for detecting signal points transmitted over a transmission line. A data transmitter encodes input data and maps this data in accordance with a Trellis Code Modulation technique. The mapped data is then modulated onto a particular carrier wave, and transmitted to a data receiver. The data receiver compensates for any detected phase shift in the carrier wave, and decodes the phase-corrected data to quickly detect parallel path information of the received data.

10 Claims, 22 Drawing Sheets

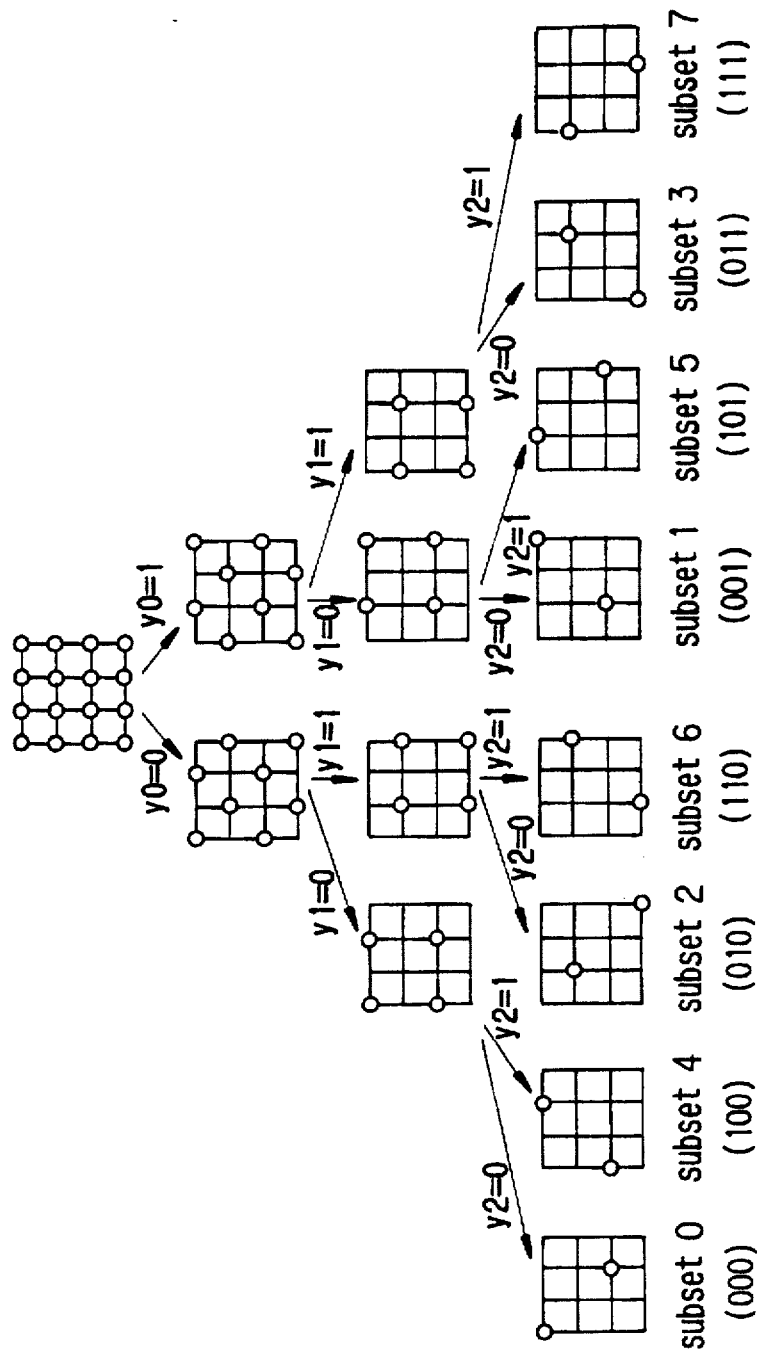

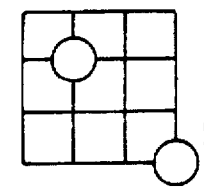
FIG.5A FIG.5B FIG.5C FIG.5D
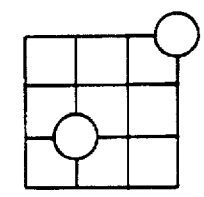
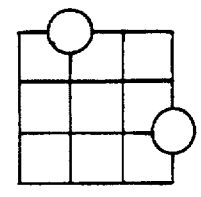
FIG.5E FIG.5F FIG.5G FIG.5H

subset 0 subset 0

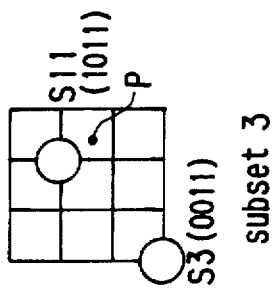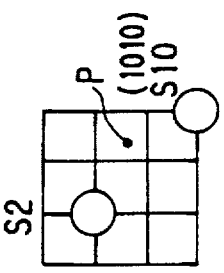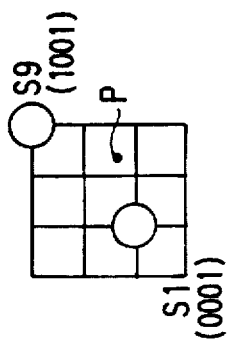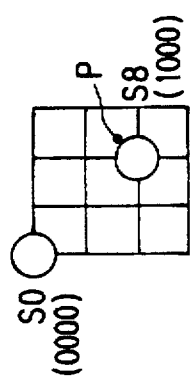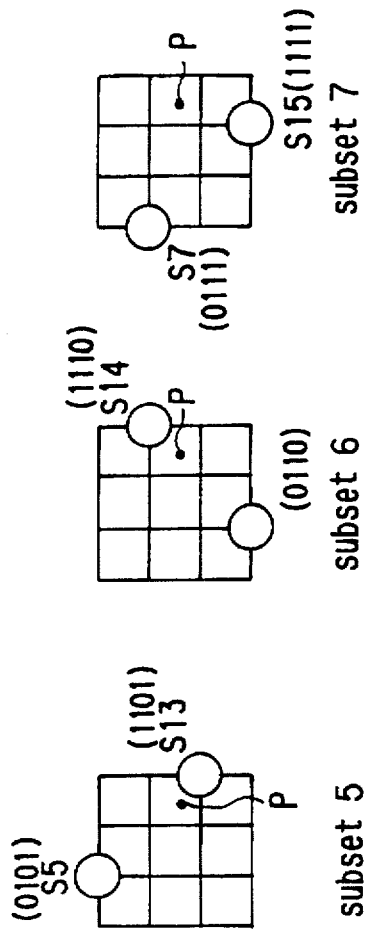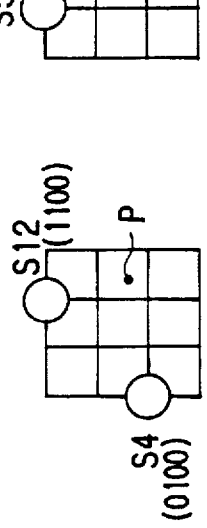

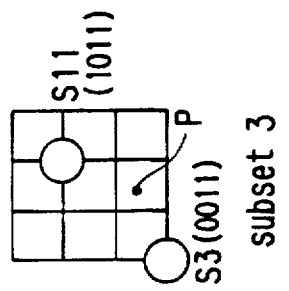
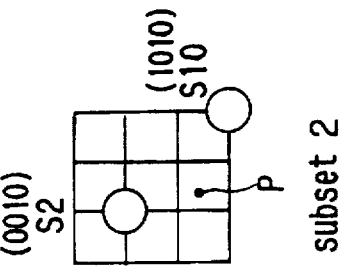
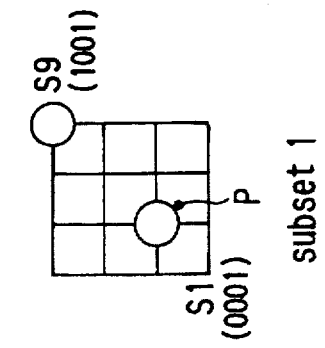
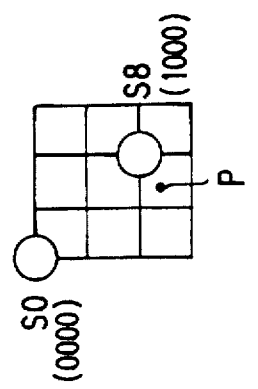
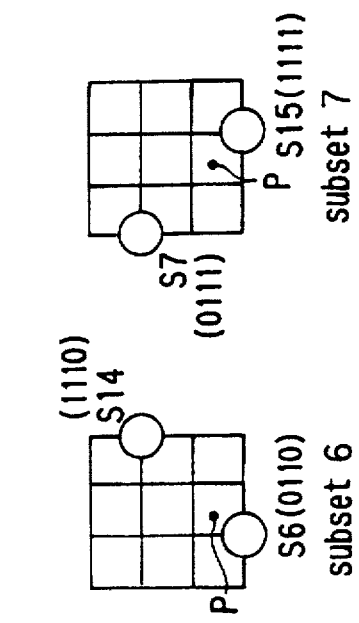
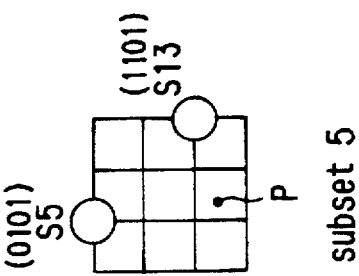
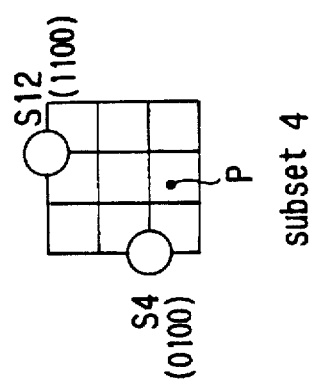
FIG.9A FIG.9B FIG.9C FIG.9D FIG.9E FIG.9F FIG.9G FIG.9H

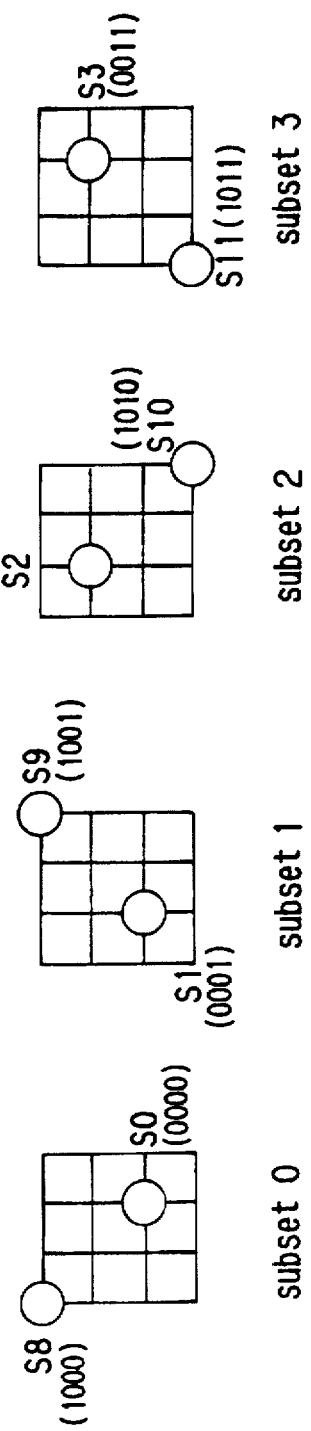

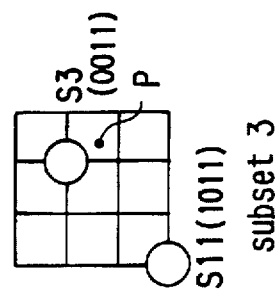
FIG.IID subset 3
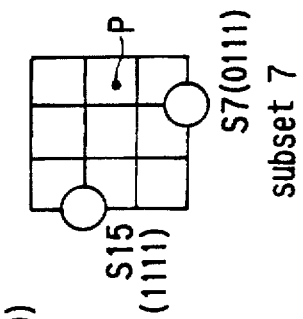
FIG.IIH subset 7
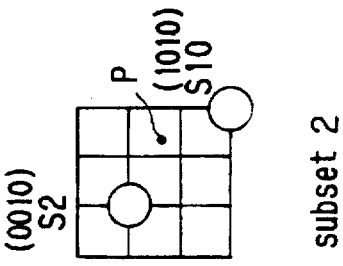
FIG.IIC subset 2
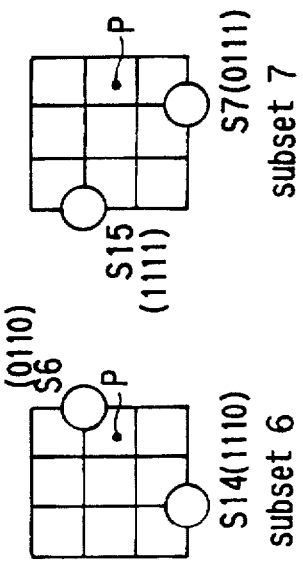
FIG.IIG subset 6
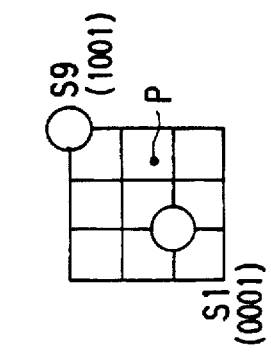
FIG.IIB subset 1
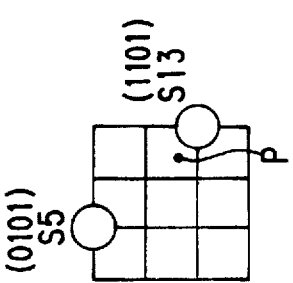
FIG.IIF subset 5
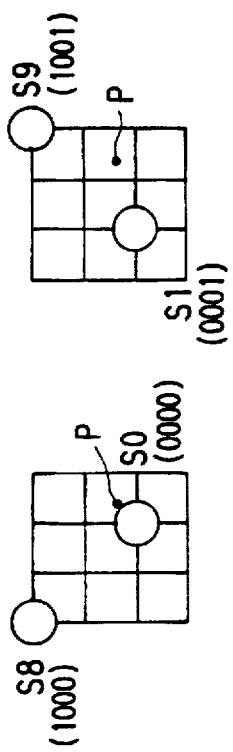
FIG.IIA subset 0
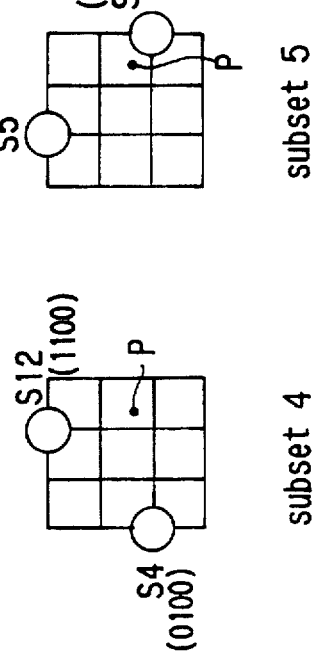
FIG.IIE subset 4

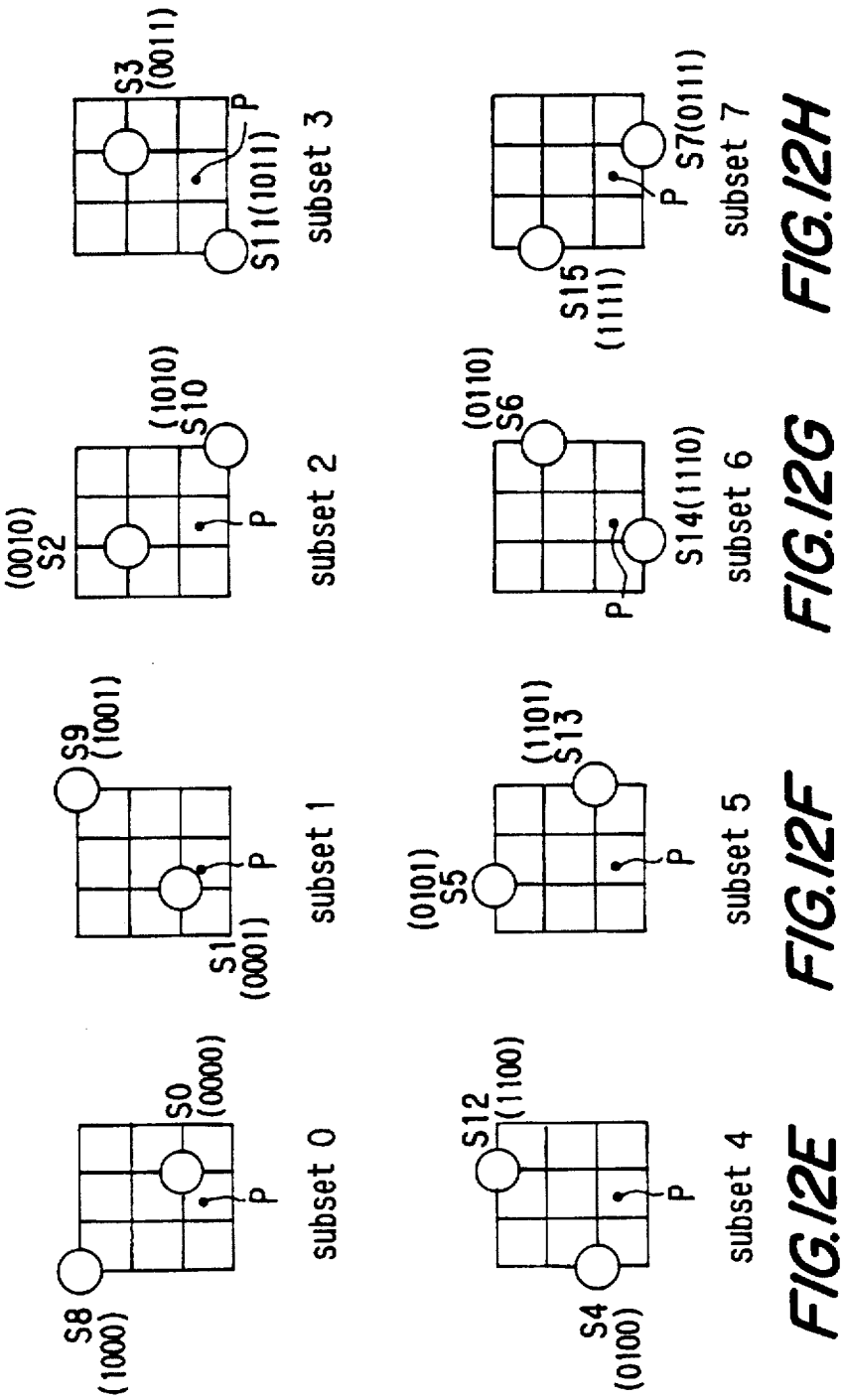

subset 0 subset 1

FIG. 17

| input | | state | | | | | | output | | |
|---|---|---|---|---|---|---|---|---|---|---|
| | | before change | | | after change | | | | | |
| $x_2$ | $x_1$ | $R_2$ | $R_1$ | $R_0$ | $R_2$ | $R_1$ | $R_0$ | $y_2$ | $y_1$ | $y_0$ |
| 0 | 0 | 0 | 0 | 0 | 0 | 0 | 0 | 0 | 0 | 0 |
| 0 | 1 | 0 | 0 | 0 | 0 | 1 | 0 | 0 | 1 | 0 |
| 1 | 0 | 0 | 0 | 0 | 0 | 0 | 1 | 1 | 0 | 0 |
| 1 | 1 | 0 | 0 | 0 | 0 | 1 | 1 | 1 | 1 | 0 |
| 0 | 0 | 0 | 0 | 1 | 1 | 0 | 0 | 0 | 0 | 1 |
| 0 | 1 | 0 | 0 | 1 | 1 | 1 | 0 | 0 | 1 | 1 |
| 1 | 0 | 0 | 0 | 1 | 1 | 0 | 1 | 1 | 0 | 1 |
| 1 | 1 | 0 | 0 | 1 | 1 | 1 | 1 | 1 | 1 | 1 |
| 0 | 0 | 0 | 1 | 0 | 0 | 0 | 1 | 0 | 0 | 0 |
| 0 | 1 | 0 | 1 | 0 | 0 | 1 | 1 | 0 | 1 | 0 |
| 1 | 0 | 0 | 1 | 0 | 0 | 0 | 0 | 1 | 0 | 0 |
| 1 | 1 | 0 | 1 | 0 | 0 | 1 | 0 | 1 | 1 | 0 |
| 0 | 0 | 0 | 1 | 1 | 1 | 0 | 1 | 0 | 0 | 1 |
| 0 | 1 | 0 | 1 | 1 | 1 | 1 | 1 | 0 | 1 | 1 |
| 1 | 0 | 0 | 1 | 1 | 1 | 0 | 0 | 1 | 0 | 1 |
| 1 | 1 | 0 | 1 | 1 | 1 | 1 | 0 | 1 | 1 | 1 |
| 0 | 0 | 1 | 0 | 0 | 0 | 1 | 0 | 0 | 0 | 0 |
| 0 | 1 | 1 | 0 | 0 | 0 | 0 | 0 | 0 | 1 | 0 |
| 1 | 0 | 1 | 0 | 0 | 0 | 1 | 1 | 1 | 0 | 0 |
| 1 | 1 | 1 | 0 | 0 | 0 | 0 | 1 | 1 | 1 | 0 |
| 0 | 0 | 1 | 0 | 1 | 1 | 1 | 0 | 0 | 0 | 1 |
| 0 | 1 | 1 | 0 | 1 | 1 | 0 | 0 | 0 | 1 | 1 |
| 1 | 0 | 1 | 0 | 1 | 1 | 1 | 1 | 1 | 0 | 1 |
| 1 | 1 | 1 | 0 | 1 | 1 | 0 | 1 | 1 | 1 | 1 |
| 0 | 0 | 1 | 1 | 0 | 0 | 1 | 1 | 0 | 0 | 0 |
| 0 | 1 | 1 | 1 | 0 | 0 | 0 | 1 | 0 | 1 | 0 |
| 1 | 0 | 1 | 1 | 0 | 0 | 1 | 0 | 1 | 0 | 0 |
| 1 | 1 | 1 | 1 | 0 | 0 | 0 | 0 | 1 | 1 | 0 |
| 0 | 0 | 1 | 1 | 1 | 1 | 1 | 1 | 0 | 0 | 1 |
| 0 | 1 | 1 | 1 | 1 | 1 | 0 | 1 | 0 | 1 | 1 |
| 1 | 0 | 1 | 1 | 1 | 1 | 1 | 0 | 1 | 0 | 1 |
| 1 | 1 | 1 | 1 | 1 | 1 | 0 | 0 | 1 | 1 | 1 |

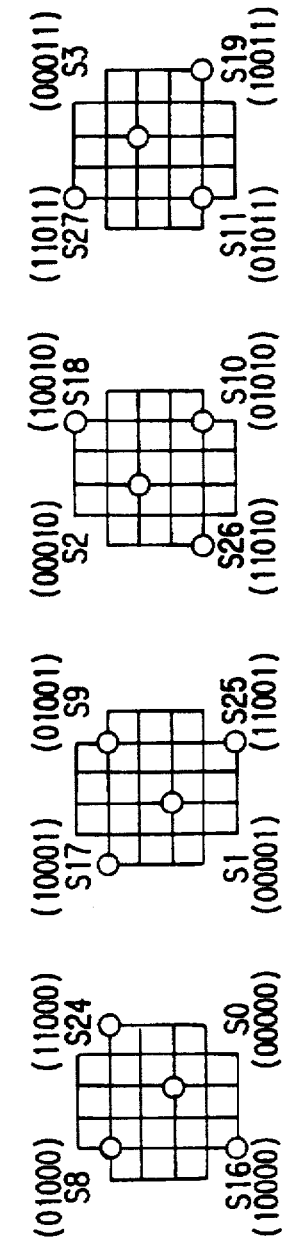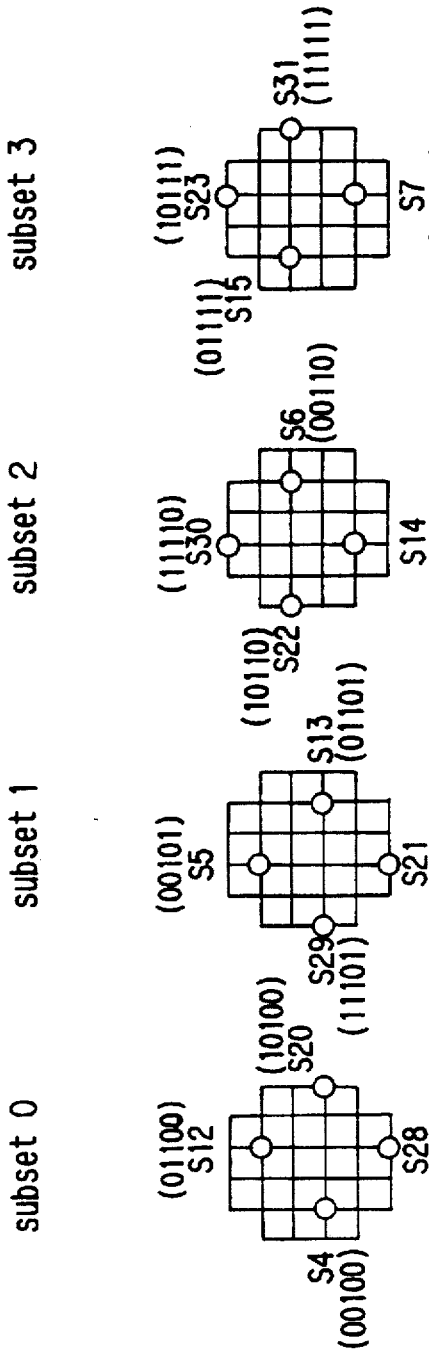

FIG.24A subset 0
FIG.24B subset 1
FIG.24C subset 2
FIG.24D subset 3
FIG.24E subset 4
FIG.24F subset 5
FIG.24G subset 6
FIG.24H subset 7

APPARATUS AND METHOD FOR DETECTING SIGNAL POINTS USING SIGNAL POINT-MAPPING

BACKGROUND OF THE INVENTION

The present invention relates to a data communication system that incorporates signal point-mapping and signal point-detecting.

One type of digital signal transmitter that has been proposed is illustrated in FIG. 1, wherein an information source 1 generates a digital signal to be transmitted. This digital signal is encoded by encoder 2, an example of which is illustrated in FIG. 2, whereby three bits of data (x3x2x1) are encoded into four bits of data (y3y2y1y0).

In FIG. 2, the 3 bits of input data (x3, x2, and x1) correspond, on a bit-by-bit basis, to the three most significant bits (y3, y2, and y1) of the output of encoder 2. Registers 11–13 and exclusive-OR circuits 14 and 15 use input bits x2 and x1 to calculate y0, which is the least significant bit of the output data (y3, y2, y1, y0).

In particular, bit x1 and data latched in register 11 are combined by exclusive-OR circuit 14, and the result is latched into register 12. The data latched in register 12 and bit x2 are combined by exclusive-OR circuit 15, and the result is latched in register 13. The data in register 13 is provided as output bit y0 and also is fed back to the input of register 11. In calculating bit y0, encoder 2 does not use the most significant bit x3 of the input signal or the most significant bit y3 of the output signal. Since these two bits do not participate in the calculation of bit y0, they are deemed to constitute a parallel path. In contrast, bits x2 and y2, and bits x1 and y1 do not constitute respective parallel paths because encoder 2 uses them to calculate bit y0. In this way, the encoder forms a convolution encoder having an encoding factor of 3/4 (ratio of input bits to output bits) and a restriction length of 4 (number of bits in the output).

The output of encoder 2 is supplied to mapping circuit 3 (FIG. 1), which maps this output according to a Trellis Code Modulation method such as PSK or QAM. Mapping circuit 3 generally comprises a ROM, which is pre-programmed with instructions for carrying out the signal point-mapping method, controlled by a CPU. The output of mapping circuit 3 is supplied to modulator 4, which then modulates a carrier wave according to the mapped signal; and the output of modulator 4 is transmitted over transmission line 5.

With respect to mapping circuit 3, a digital modulation method known as "16QAM" may be used, for example. This is explained by recognizing that each 4-bit output signal (y3y2y1y0) can have any one of 16 possible values (0 to 15), so that the value of each such output signal is mapped to its corresponding signal point, as shown in FIG. 3. For example, if the output signal has a value of 2 (i.e., 0010 in binary notation), then the value of this output is mapped to signal point S2. If the output signal has a value of 8 (1000), it is mapped to signal point S8.

The sixteen signal points shown in FIG. 3 can each be resolved into two mutually perpendicular components, I and Q. The I component can be referred to as the cosine component, and the Q component can be viewed as the sine component. Each signal point is randomly assigned to a particular coordinate value in FIG. 3. For example, signal point S9 in FIG. 3 can be represented by the following equation:

$$S9 = 3 \cos \omega t + 3 \sin \omega t \tag{1}$$

If $S_{ii}$ and $S_{iq}$ are the equalized I component and Q component, respectively, of the signal point Si, equation (1) above can be generalized by the following formula:

$$Si = S_{ii} \times \cos \omega t + S_{iq} \times \sin \omega t \tag{2}$$

where $\omega$ is the angular frequency of the carrier wave, and t is time.

The sixteen signal points S0–S15 shown in FIG. 3 are mapped from the 4 bits of information (y3y2y1y0) by the mapping circuit 3. According to the results of the mapping, the modulator 4 modulates the amplitude and phase of the carrier wave. That is, the product of the carrier wave and the I component is computed, the product of the carrier wave phase-shifted by 90 degrees and the Q component is computed, and both products are summed to produce an output signal. An encoded output signal (y3y2y1y0) that is mapped in accordance with the random arrangement of FIG. 3 will be vulnerable to noise in transmission line 5. Such noise is largely, though not exclusively, attributable to temperature variations that occur within the transmission line itself.

In order to reduce this vulnerability to transmission line noise, the 16 signal points are divided into 8 subsets or groups by a so-called set division method. The result of this set division method is illustrated in FIG. 4.

As shown in FIG. 4, the 16 signal points are divided into two subsets such that the distances between the signal points in each subset is maximized. Each subset is divided again into two subsets, and the distances between signal points in each of these subsets is also maximized. Each of these subsets is divided again into two subsets, and the distance between signal points here is also maximized. In this way, each subset is divided until, ultimately, the final subset contains two signal points. As a result, as shown in FIG. 5, eight subsets 0–7 are derived. Each subset includes two of the signal points of FIG. 3. For example, subset 0 includes signal point S0 (which has a value of (0000)) and signal point S8 (which has a value of (1000)). The signal points are paired in such a way that the three least significant bits of each signal point value in a subset are the same. Moreover, in each subset, the most significant bits of each signal point value (which correspond to the parallel path of FIG. 17) always are of opposite values. For example, in subset 0, the most significant bit of signal point S0 is "0", and the most significant bit of signal point S8 is "1"; furthermore, the three least significant bits of signal points S0 and S8 are "000".

With respect to the remaining subsets, subset 1 contains signal points S1 (0001) and S9 (1001). Subset 2 contains signal points S2 (0010) and S10 (1010). Subset 3 contains signal points S3 (0011) and S11 (1011). Subsets 4–7 contain similarly related signal points S4 and S12; S5 and S13; S6 and S14; and S7 and S15.

Within each subset of FIG. 5, the signal points can be arbitrarily assigned to each available location. For example, in subset 0, two signal points S0 and S8 can be assigned in such a way that the left upper point shown in FIG. 6A is allocated to S8, while the point shifted from the center slightly downwardly to the right is allocated to S0. As shown in FIG. 6B, the reverse allocation is also possible.

In this way, data mapped by the mapping circuit 3 as shown in FIG. 5 is entered into the modulator 4. The phase and amplitude of the carrier wave are modulated according to its signal points, and the wave is transmitted over the transmission line 5. That is, the modulator 4 generates the carrier wave represented by equation (2) above according to the signal point Si for transmission over the transmission line 5.

The carrier wave thus transmitted over the transmission line is received by a receiver constructed as shown in FIG. 7. In particular, demodulator 31 detects the I and Q components by performing a quadrature-carrier detection on the received carrier wave. These I and Q components are supplied to decoder 32, which is composed of a Viterbi decoder, for example. Decoder 32 decodes the I and Q components into the 3 bits of data (x3x2x1) that were originally generated at information source 1 of the digital transmitter.

In order for decoder 32 to decode a received signal point, it must determine to which of the 16 possible signal points of FIG. 5 the received signal point (which is specified by the I and Q components) corresponds. For example, as shown in FIG. 8, let it be assumed that P is a received signal point that has been demodulated by demodulator 31. Ideally, the position of signal point P would coincide precisely with the position of one of the 16 signal points in FIG. 8. However, noise in transmission line 5 degrades the received I and Q components of signal point P and this deterioration diverts the true position of signal point P from its ideal position. Decoder 32 finds the squares of the Euclidean distances between this signal point P and signal points S0–S15 of subsets 0–7. These distances are referred to as branch metrics. Decoder 32 assigns to signal point P the value of the signal point in FIG. 8 that is closest to signal point P. In subset 0 of FIG. 8, signal point P is closest to signal point S8. Therefore, signal point P is decoded as signal point S8, i.e., decoded as data 1000.

When a signal modulated as represented by equation (2) above is demodulated, the carrier wave is reproduced from the I and Q components by quadrature detection. The product of the reproduced carrier wave and the received signal is calculated, thus reproducing the I component, and the product of the 90° phase-shifted reproduced carrier wave and the received signal is calculated, thus reproducing the Q component.

In a 90°-symmetrical system such as 16QAM, the carrier wave may be reproduced by a so-called Costas loop, which is well-known in the prior art. Nevertheless, if a carrier wave is reproduced by this method, phase shifts of 90°, 180°, or 270° may occur therein.

For example, where no phase shift occurs, it is assumed that a signal point P as shown in FIG. 8 is received. If a phase shift of 90 degrees occurs, the signal point P is positioned in locations as shown in FIG. 9 in the subsets 0–7. For example, when decoder 32 performs Viterbi decoding on signal point P, it calculates the branch metrics for each of the subsets 0–7. Decoder 32 then determines the minimum branch metric. As explained above, decoder 32 assigns to received signal point P the value of the closest signal point of FIG. 8. Decoder 32 then obtains from this value information about the parallel path of this signal point, which corresponds to the most significant bit of the value of this signal point. For example, in FIG. 2, bit x3 is the information corresponding to the parallel path.

As shown in FIG. 9, if the phase of the reproduced carrier wave (and, accordingly, the received signal point) shifts by 90°, the branch metrics in subsets 0–7 will consequently have incorrect values. Therefore, in order to obtain correct branch metrics, the position of signal point P must be returned to its correct position as shown in FIG. 8.

In practice, however, correct branch metrics can be obtained without reshifting signal point P to the positions illustrated in FIG. 8. For example, where signal point P is rotated through 90 degrees, the squared Euclidean distance between the correct signal point P and signal point S0 in subset 0 and the squared Euclidean distance between signal point P and signal point S8 (i.e., the branch metric of subset 0 in FIG. 8) are equal to the squared Euclidean distance between signal point P and signal point S9 and the squared Euclidean distance between signal point P and signal point S1 in subset 1 in FIG. 9 (i.e., branch metric of subset 1 in FIG. 9).

Also, the squared Euclidean distance between the correct signal point P and signal point S9 in the subset 1 and the squared Euclidean distance between signal point P and signal point S1 (i.e., the branch metric of subset 1 in FIG. 8) are equal to values calculated in subset 2 in FIG. 9. That is, the squared Euclidean distance between signal point P and signal point S10 in subset 2 in FIG. 9 and the squared Euclidean distance between signal point P and signal point S2 are equal, respectively, to the squared Euclidean distance between signal point P and signal point S9 in subset 1 shown in FIG. 8 and the squared Euclidean distance between signal point P and signal point S1.

Similarly, the correct branch metric in subset 2 in FIG. 8 corresponds to a branch metric calculated in subset 3 in FIG. 9. The correct branch metric in subset 3 in FIG. 8 corresponds to a branch metric calculated in subset 0 in FIG. 9.

Furthermore, the correct branch metric in subset 4 in FIG. 8 corresponds to a branch metric calculated in subset 5 in FIG. 9. The correct branch metric in subset 5 in FIG. 8 corresponds to a branch metric calculated in subset 6 in FIG. 9. The correct branch metric in subset 6 in FIG. 8 corresponds to a branch metric computed in subset 7 in FIG. 9. And the correct branch metric in subset 7 in FIG. 8 corresponds to a branch metric calculated in subset 4 in FIG. 9.

Therefore, if the phase of a carrier wave is shifted by 90 degrees, correct branch metrics (i.e., branch metrics corresponding to a single point that has not been phase-shifted) can be obtained by realizing that the branch metrics of unshifted subsets 0,1,2,3 ( FIG. 8) are equal to the branch metrics of shifted subsets 1,2,3,0 (FIG. 9), respectively, and that the branch metrics of unshifted subsets 4,5,6,7 (FIG. 8) are equal to the branch metrics of shifted subsets 5,6,7,4 (FIG. 9), respectively. "Unshifted" refers to a phase shift of 0 degrees, and "shifted" refers to a phase shift of 0, 90, 180, or 270 degrees.

The disadvantage of this proposed system is that relying on adjacent subsets to obtain correct branch metrics will not yield correct parallel path information. As explained before, the information relating to a parallel path corresponds to the most significant bit of each signal point value. In subset 0 of FIG. 8 (which illustrates unshifted branch metrics), signal point S0 has parallel path data equal to 0, and signal point S8 has parallel path data equal to 1. In FIG. 9 (which illustrates shifted branch metrics), shifted signal point S9 has parallel path data equal to 1, and shifted signal point S1 has parallel path data equal to 0. As stated before, the branch metrics between signal point P and signal points S9 and S1 in shifted subset 1 (FIG. 9) are equal to the branch metrics between signal point P and signal points S0 and S8 in unshifted subset 0 (FIG. 8). Thus, unshifted signal point S8 (FIG. 8) corresponds to shifted signal point S1 (FIG. 9). However, the parallel path data of shifted signal point S9 (i.e., 1 of FIG. 9) does not equal the parallel path data of unshifted signal point S0 (i.e., 0 of FIG. 8). The same incongruity holds true for shifted signal point S1 and unshifted signal point S8. Therefore, in this proposed system, the obtained parallel path data of FIG. 9 must be recalculated to obtain the correct parallel path data of FIG. 8. But repeating this detection processing is time-consuming.

In view of the foregoing situations, the present invention has been made. The present invention is intended to detect information about parallel paths more quickly.

OBJECTS OF THE INVENTION

Therefore, it is an object of the present invention to provide an improved data communication system that overcomes the aforenoted disadvantages in detecting parallel path data.

Another object of this invention is to provide an improved data communication system that generates angular information corresponding to a detected phase shift in the carrier wave of a received information signal.

A further object of this invention is to provide an improved decoder that uses this angular information to compensate for a detected phase shift in the carrier wave of a received information signal.

An additional object of the present invention is to provide a sert division method that arranges signal points in subsets so that the parallel path data of one signal point in one subject is the same as the parallel path data of a corresponding signal point in an adjacent subset.

Various other objects, advantages and features of the present invention will become readily apparent from the ensuing detailed description, and the novel features will be particularly pointed out in the appended claims.

SUMMARY OF THE INVENTION

In accordance with this invention, information is mapped onto signal points by mapping encoded information onto signal points, digitally modulating the encoded information by a given digital modulation technique, and transmitting the modulated information. The signal points are divided into plural subsets including a first subset having two or more of the signal points and a second subset, the two subsets being arranged symmetrically with respect to a point so that when the first subset is rotated through an angle Φ about an origin, two or more of the signal points correspond to two or more of the signal points of the second subset. The second subset is brought into agreement with the most significant or upper bits of the first subset corresponding to a parallel path for the signal points of the first subset when the first subset is rotated through Φ.

Advantageously, the digital modulation method is QAM, and the angle Φ is 90 degrees.

The signal points in the received, modulated signal are detected by calculating branch metrics between the received signal points and the plural subsets and detecting the most significant or upper bits corresponding to the parallel paths in the subsets of the received signal points.

Phase rotation of the received carrier wave is detected and desired ones of sets of the most significant or upper bits of the signal points and the branch metrics are selected according to the phase rotation of the carrier wave.

Since the second subset had been brought into agreement with the most significant or upper bits of the first subset corresponding to a parallel path for the signal points of the first subset when the first subset is rotated through Φ, when the signal point is rotated through this angle Φ, information about parallel paths can be detected quickly.

Furthermore, since desired ones of sets of the most significant or upper bits of the signal points and the branch metrics are selected according to the phase rotation of the phase of the carrier wave, the signal points can be detected quickly.

BRIEF DESCRIPTION OF THE DRAWINGS

The following detailed description, given by way of example and not intended to limit the present invention solely thereto, will best be understood in conjunction with the accompanying drawings in which:

FIG. 4 is a diagram illustrating a set division method;

FIG. 5 is a diagram illustrating the mapping method used in the previously proposed transmitter;

FIG. 8 is a diagram illustrating the relations among each signal point received by the previously proposed mapping method and each subset;

FIG. 9 is a diagram illustrating the relations among each signal point whose phase has been rotated and each subset;

FIG. 10 is a diagram illustrating a signal point-mapping method according to the present invention;

FIG. 11 is a diagram illustrating the relations between each received signal point and each subset;

FIG. 12 is a diagram illustrating the relations between each received signal point whose phase has been rotated and each subset;

FIG. 17 is a diagram illustrating the relations among data items at various portions of the encoder illustrated in FIG. 2;

FIG. 22 is a diagram illustrating mapping used where the encoder constructed as shown in FIG. 21 is used;

DETAILED DESCRIPTION OF THE INVENTION

Figure 1:
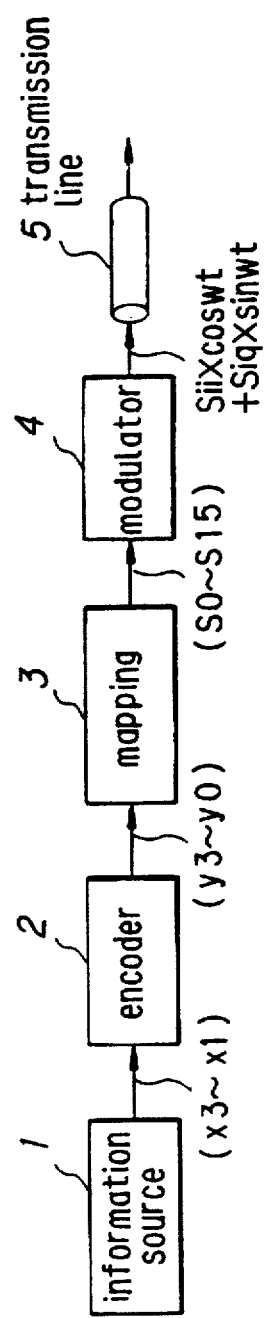
FIG. 1 is a block diagram showing the structure of a previously proposed digital transmitter.
Figure 7:
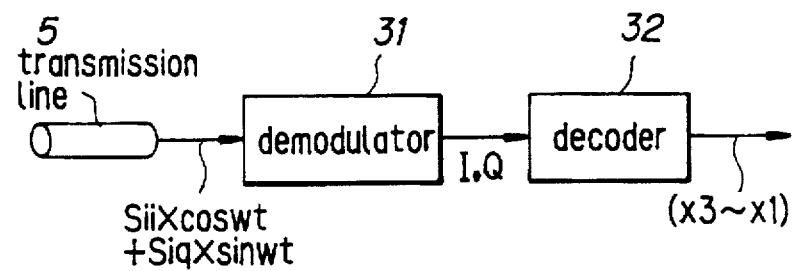
FIG. 7 is a block diagram showing an example of the structure of a receiver adapted to receive the signal transmitted by the transmitter of FIG. 1.

A method and apparatus for signal point-mapping and signal point-detecting according to the present invention are described hereafter. A digital signal transmitter and a digital signal receiver to which these methods are applied are similar to the previously proposed transmitter and receiver shown in FIGS. 1 and 7, respectively. However, the signal point-mapping method used in mapping circuit 3 (FIG. 1) and the signal point-detecting method used in decoder 32 (FIG. 7) are different from those described above.

Figure 2:
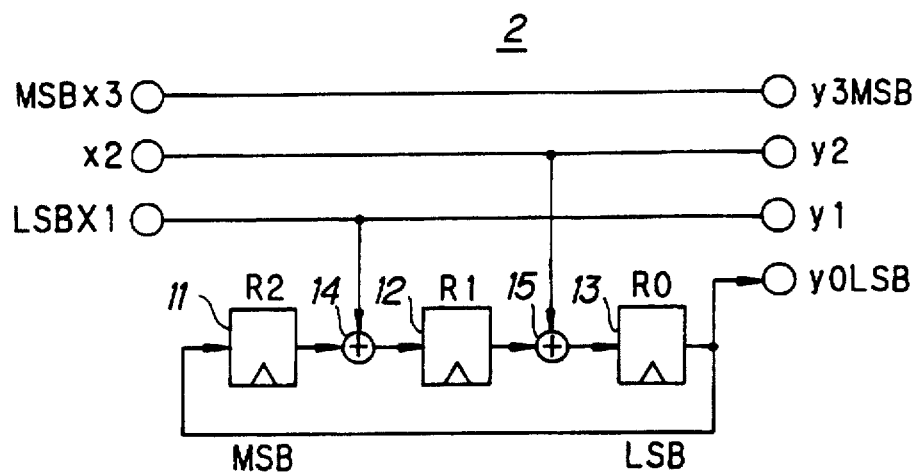
FIG. 2 is a block diagram of an example of the structure of the encoder 2 shown in FIG. 1.
Figure 3:
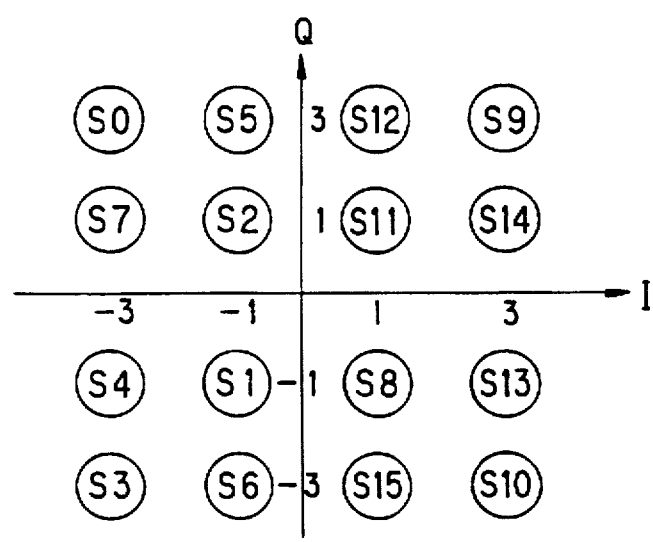
FIG. 3 is a diagram illustrating mapping performed by the mapping circuit 3 shown in FIG. 1.
Figure 6A:
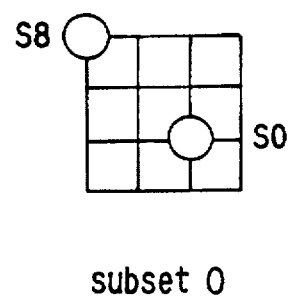
FIGS. 6A and 6B are diagrams illustrating signal points in subsets.
Figure 6B:
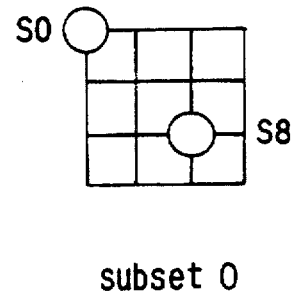

In the present invention, the encoder 2 illustrated in FIG. 2 encodes 3 bits of input data (x3x2x1) into 4 bits of data (y3y2y1y0) which are mapped onto 16 signal points by mapping circuit 3. The 16 signal points are divided into 8 subsets 0–7 by the set division method illustrated in FIG. 4. These subsets are illustrated again in FIG. 10, and they embody the novel signal point-mapping of the present invention. In this division processing, the signal points are so arranged that when subset 0 is rotated through 90 degrees in a clockwise direction, the two signal points in subset 0 correspond to the two signal points in subset 1, in the same way as in the previously discussed techniques.

Similarly, the signal points are arranged such that when subset 1 is rotated through 90 degrees in a clockwise direction, its two signal points correspond to the two signal points in subset 2; when subset 2 is rotated through 90 degrees in a clockwise direction, its two signal points correspond to the two signal points in subset 3; and when subset 3 is rotated through 90 degrees in a clockwise direction, its two signal points correspond to the two signal points in subset 0.

Similarly, the signal points in each of subsets 4–7 are arranged such that when the immediately previous subset is rotated through 90 degrees in a clockwise direction, its two signal points correspond to the two signal points in the following subset.

In this way, subsets i and (i+1) are arranged symmetrically with respect to a point so that when the first subset i is rotated through 90 degrees in a clockwise direction, its signal points correspond to the second subset (i+1). Furthermore, unlike the previously described signal point-mapping technique, the signal points in the present invention are so arranged that information corresponding to a parallel path of signal points of subset i agrees with information about a parallel path of the corresponding signal points of the subset (i+1).

For example, subset 0 has two signal points S0 and S8. Subset 1, to which subset 0 corresponds when subset 0 is rotated through 90 degrees in a clockwise direction, has two signal points S1 and S9. The signal point corresponding to signal point S0 (0000) has a MSB of 0, and it corresponds with signal point S1 (0001), which also has an MSB of 0. Similarly, signal point S9 (1001) has an MSB of 1, and corresponds with signal point S8 (1000) which also has an MSB of 1. Thus, the signal point-mapping method of FIG. 10 differs from the previously described signal point-mapping method of FIG. 8 because unshifted signal points in the present invention are made to correspond to shifted signal points that have the same parallel path information. Therefore, the signal point-mapping method of FIG. 10 does not require the time-consuming repetition of detection processing that is necessary to obtain correct parallel path information in the signal point mapping method of FIG. 8.

As for subsets 1 and 2, signal point S2 (0010) of subset 2, which has an MSB of 0, corresponds with signal point S1 (0001) of subset 1, which also has an MSB of 0. Signal point S10 (1010), which has an MSB of 1, corresponds with signal point S9 (1001), which also has an MSB of 1.

As for subsets 2 and 3, signal point S3 (0011) of subset 3, which has an MSB of 0, corresponds with signal point S2 (0010) of subset 2, which has a MSB of 0. Signal point S11 (1011), which has a MSB of 1, corresponds with signal point S10 (1010), which has a MSB of 1. As for subsets 3 and 0, signal point S0 (0000) of subset 0, which has a MSB of 0, corresponds with signal point S3 (0011) of subset 3, which has a MSB of 0. Signal point S8 (1000), which has a MSB of 1, corresponds with signal point S11 (1011), which has a MSB of 1.

This processing is also carried out for subsets 4–7. That is, signal point S5 (0101) of subset 5, which has a MSB of 0, corresponds with signal point S4 (0100) of subset 4, which has a MSB of 0. Signal point S13 (1101), which has a MSB of 1, corresponds with signal point S12 (1100), which has a MSB of 1. Signal point S6 (0110) of subset 6, which has a MSB of 0, corresponds with signal point S5 (0101) of subset 5, which has a MSB of 0. Signal point S14 (1110), which has a MSB of 1, corresponds with signal point S13 (1101), which as a MSB of 1.

Signal point S7 (0111) of subset 7, which has a MSB of 0, corresponds with signal point S6 (0110) of subset 6, which has a MSB of 0. Signal point S15 (1111), which has a MSB of 1, corresponds with signal point S14 (1110), which has a MSB of 1. Signal point S4 (0100) of subset 4, which has a MSB of 0, corresponds with signal point S7 (0111) of subset 7, which has a MSB of 0. Signal point S12 (1100), which has a MSB of 1, corresponds with signal point S15 (1111), which has a MSB of 1.

FIG. 11 illustrates signal point P relative to the signal points of FIG. 10. Signal point P is the signal received at decoder 32 from transmission line 5. If the carrier wave is rotated through 90 degrees, the position of signal point P relative to the signal points in each subset is as shown in FIG. 12.

Figure 13:
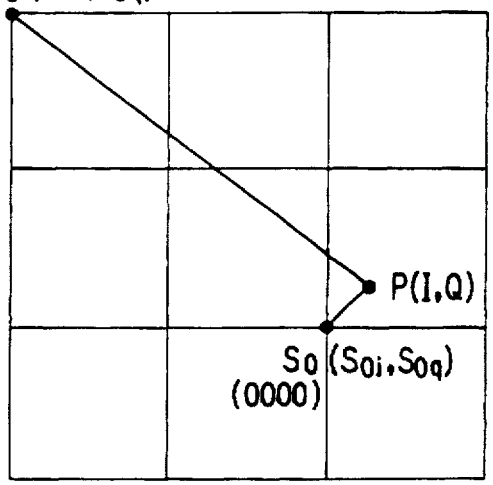
FIG. 13 is a diagram illustrating branch metrics in subset 0 illustrated in FIG. 11.

In subset 0, for example, when the phase of the carrier is not rotated through 90 degrees, the squared Euclidean distance $BM_{01}$ between signal points P (I, Q) and S0 ($S_{0i}$, $S_{0q}$), and the squared Euclidean distance $BM_{02}$ between signal points P (I, Q) and S8 ($S_{8i}$, $S_{8q}$), as shown in FIG. 13, can be respectively given by:

$$BM_{01}=(I-S_{0i})^2+(Q-S_{0q})^2$$

$$BM_{02}=(I-S_{8i})^2+(Q-S_{8q})^2$$

Figure 14:
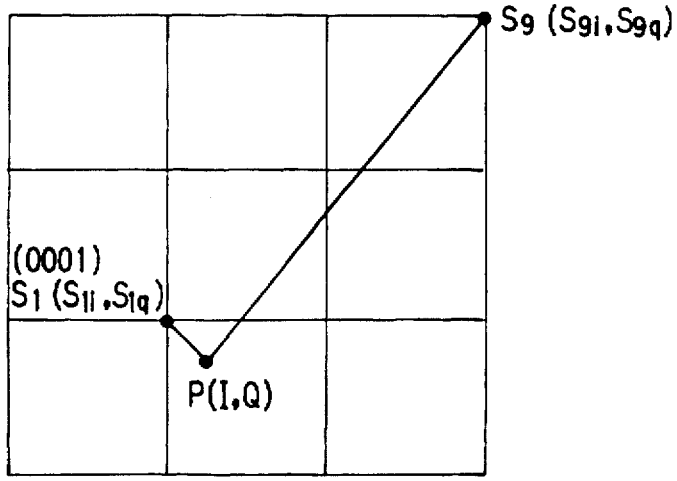
FIG. 14 is a diagram illustrating branch metrics in subset 1 illustrated in FIG. 12.

(where BM is an acronym for "branch metric"). On the other hand, when a signal point is rotated through 90 degrees, the resulting signal point arrangement as shown in FIG. 14 appears as subset 1 in FIG. 12. In this subset 1, the following squared Euclidean distances are found:

$$BM_{11}=(I-S_{1i})^2+(Q-S_{1q})^2$$

$$BM_{12}=(I-S_{9i})^2+(Q-S_{9q})^2$$

As can be seen by comparing FIG. 14 with FIG. 13, the squared Euclidean distance $BM_{01}$ in subset 0 of FIG. 13 is equal to the squared Euclidean distance $BM_{11}$ found in subset 1 of FIG. 14. Also, the squared Euclidean distance $BM_{02}$ in subset 0 of FIG. 13 is equal to the squared Euclidean distance $BM_{12}$ in subset 1 of FIG. 14. Therefore, when the phase of the carrier wave has been rotated through 90 degrees, the squared Euclidean distance $BM_{11}$ or $BM_{12}$ of subset 1 can be used as the squared Euclidean distance $BM_{01}$ or $BM_{02}$ of the subset 0.

In FIG. 13, unshifted signal point S8 (1000) of subset 0, which has a MSB of 1, corresponds to signal point S9 (1001) of subset 1 in FIG. 14, which has a MSB of 1 and which has been rotated through 90 degrees. Therefore, signal point S8 and signal point S9 have identical parallel path information because their MSBs are 1s. Similarly, signal point S0 (0000) of subset 0 (FIG. 13), which has a MSB of 0 corresponds to signal point S1 (0001) of subset 1 (FIG. 14), which also has an MSB of 0. Since signal point S0 and signal point S1 have the same MSB, information corresponding to the parallel path of subset 1 when the phase of signal point P has been rotated through 90 degrees can be used as information corresponding to the parallel path of subset 0 when the phase of signal point P has not been rotated through 90 degrees.

The foregoing principle applies to the relations between other mutually corresponding subsets.

In the present invention, digital information consisting of 4 bits (y3y2y1y0) is mapped by mapping circuit 3 in the manner described, and this information is then modulated by modulator 4 and transmitted over transmission line 5. At the receiver, information conveyed by modulating the phase and amplitude of the carrier wave is supplied to demodulator 31, where the wave is demodulated into the I component and the Q component. Then, decoder 32 decodes the demodulated components into the original 3 bits of data (x3x2x1).

Figure 15:
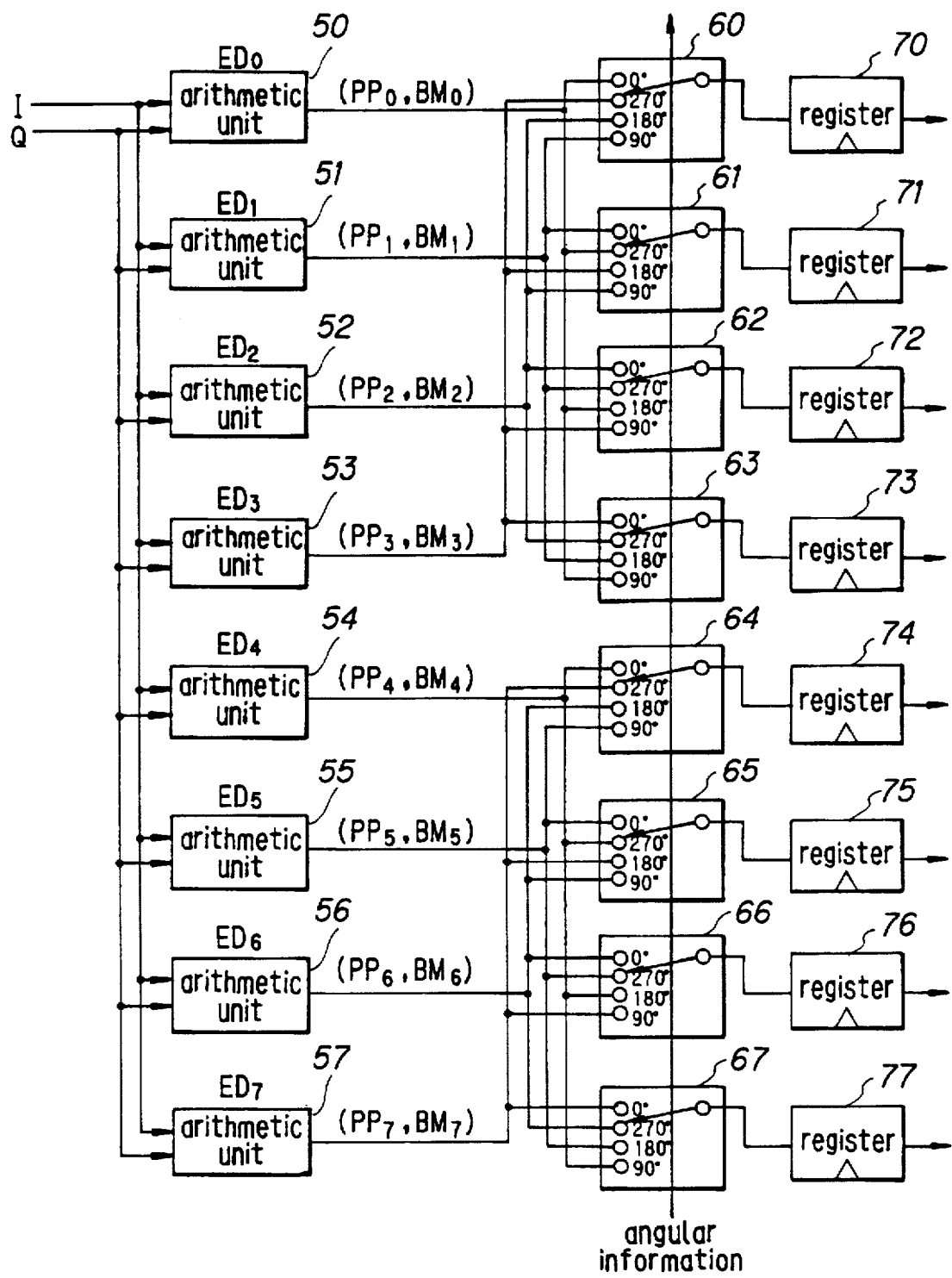
FIG. 15 is a block diagram showing an example of the structure of a decoder to which the novel signal point-detecting method is applied.
Figure 16:
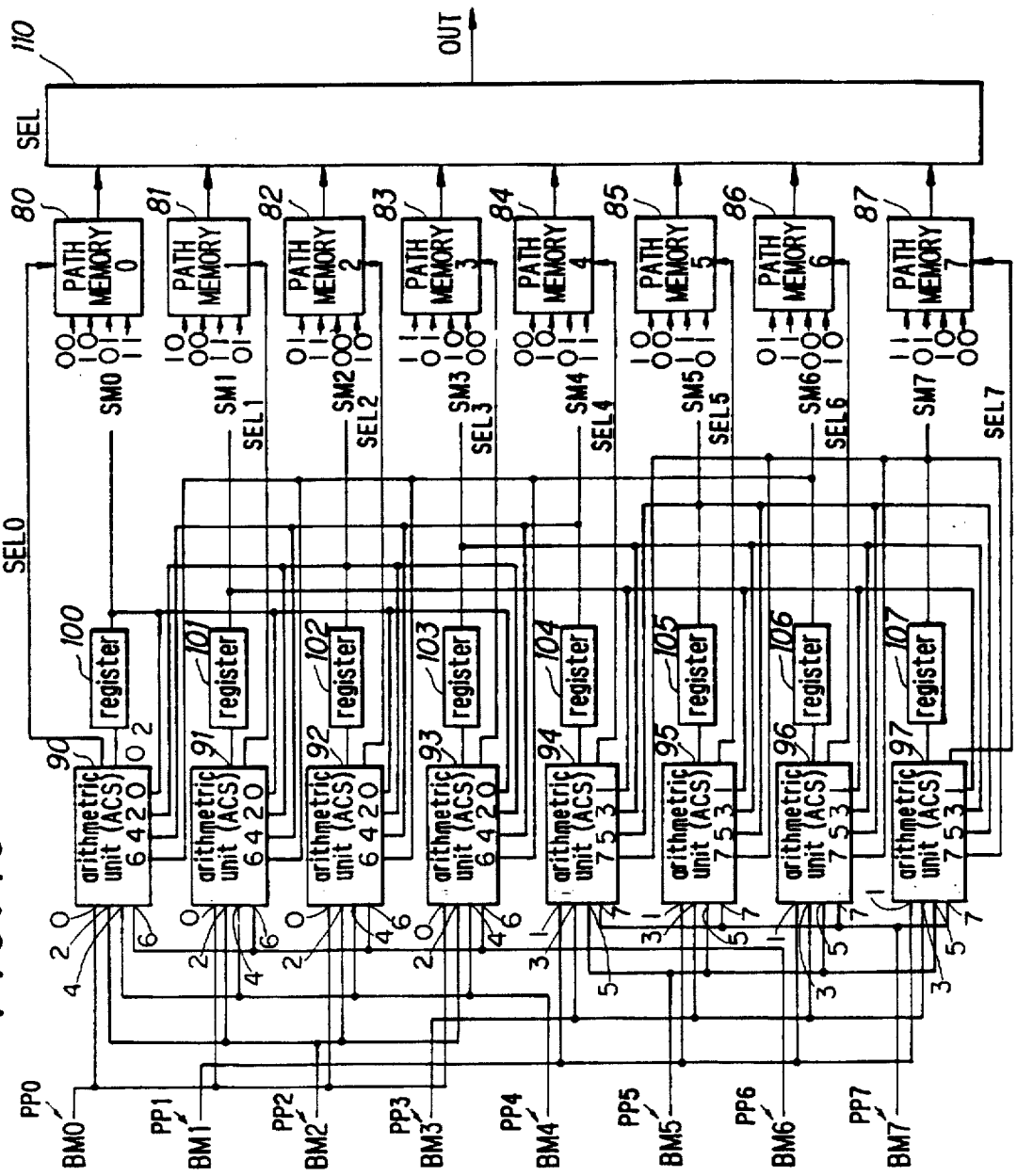
FIG. 16 is a block diagram showing an example of the structure of a circuit for calculating state metrics.

Decoder 32 preferably is constructed as shown in FIGS. 15 and 16, for example. FIG. 15 illustrates the portion of decoder 32 that corrects for any phase shifts in signal point P, and FIG. 16 illustrates the portion of the decoder that decodes the phase-corrected signal point P. Demodulator 31 uses quadrature detection to demodulate the I component (Sii) and Q component (Siq) from the carrier wave received from transmission line 5. These I and Q components are supplied to arithmetic elements 50-57 (ED0-ED7), each of which corresponds to a particular subset and each comprising, for example, a ROM. For example, arithmetic element ED0 corresponds to subset 0; arithmetic element ED1 corresponds to subset 1, etc. Each arithmetic element stores the I and Q components of each signal point that belongs to its corresponding subset. For example, arithmetic element ED0 stores the I and Q components of signal points S8 and S0, arithmetic element ED1 stores the I and Q components of signal points S9 and S1, etc. Each arithmetic element 50-57 uses the stored data to calculate the squared Euclidean distance between signal point P (I, Q) of the received signal and the signal points of the corresponding subset according to the following formula:

$$ED_j = (I-S_{ii})^2 + (Q-S_{iq})^2 \quad (3)$$

The arithmetic elements 50-57 determine the minimum values of the calculated Euclidean distances $ED_j$ ($ED_{j1}$, $ED_{j2}$) and use the minimum values as branch metrics BMi. Also, the arithmetic elements produce information, or identifiers, PPi corresponding to parallel paths. For example, the arithmetic element 50 calculates the squared Euclidean distance between the signal points S0 and P shown in FIG. 13, as given by $$ED_{01} = (I-S_{0i})^2 + (Q-S_{0q})^2$$

The squared Euclidean distance $ED_{02}$ between the signal points S8 and P is calculated as $$ED_{02} = (I-S_{8i})^2 + (Q-S_{8q})^2$$

Arithmetic element ED0 then outputs the smaller of these distances as branch metric BM0.

Furthermore, arithmetic element ED0 also outputs as parallel path information (PP0) the MSB of the signal point that is closest to signal point P. In the example illustrated in FIG. 13, the squared Euclidean distance $BM_{01}$ between the signal points S0 and P is smaller than the squared Euclidean distance $BM_{02}$ between the signal points S8 and P. Thus, $BM0=BM_{01}$. PP0 is set to the MSB of the selected signal point S0, i.e., PP0=0.

Arithmetic element 51 calculates the squared Euclidean distance between signal point P and signal point S1 and the squared Euclidean distance between signal point P and signal point S9. Arithmetic element 51 then delivers the smaller of these distances as branch metric BM1. Arithmetic element 51 also outputs the parallel path information (PPI) that corresponds to the signal point that is closest to signal point P. For example, if this signal point is S1, then PPI=0; if this signal point is S9, then PP1=1.

Arithmetic elements 52-57 perform similar processing with respect to subsets 2-7. Arithmetic elements 50-57 then supply their respective outputs (BM0, PP0 through BM7, PP7) to switches 60-67. These switches are schematically illustrated as having respective inputs 0°, 90°, 180° and 270°; and arithmetic element 50 supplies its output (PPO, BMO) to the 0°-input of switch 60, the 270°-input of switch 61, the 180°-input of switch 62, and the 90°-input of switch 63. Arithmetic element 51 supplies its output (PP1, BM1) to the 90°-input of switch 60, the 0°-input of switch 61, the 270°-input of switch 62, and the 180°-input of switch 63. Arithmetic element 52 supplies its output (PP2, BM2) to the 180°-input of switch 60, the 90°-input of switch 61, the 0°-input of switch 62, and the 270°-input of the switch 63. Arithmetic element 53 supplies its output (PP3, BM3) to the 270°- input of switch 60, the 180°-input of switch 61, the 90°-input of switch 62, and the 0°-input of switch 63.

Similarly, arithmetic element 54 supplies its output (PP4, BM4) to the 0°-input of switch 64, the 270°-input of switch 65, the 180°-input of switch 66, and the 90°-input of switch 67. Arithmetic element 55 supplies its output (PP5, BM5) to the 90°-input of switch 64, the 0°-input of switch 65, the 270°-input of switch 66, and the 180°-input of switch 67. Arithmetic element 56 supplies its output (PP6, BM6) to the 180°-input of switch 64, the 90°-input of switch 65, the 0°-input of switch 66, and the 270°- input of switch 67. Arithmetic element 57 supplies its output (PP7, BM7) to the 270°-input of switch 64, the 180°-input of switch 65, the 90°-input of switch 66, and the 0°-input of switch 67.

Each of these switches 60-67 can switch to any one of its four inputs, depending on the angular information supplied from a circuit (not shown in FIG. 15) that will be described later with respect to FIG. 19. This angular information corresponds to the shift of the phase of the carrier wave. If the shift is 0, then the switches are switched to their respective 0°-inputs. If the shift is 90 degrees, the switches are switched to their respective 90°-inputs. If the shift is 180 degrees, the switches are switched to their respective 180°-inputs. If the shift in 270 degrees, the switches are switched to their respective 270°-inputs.

Any information that appears at the output of switch 60 is designated as branch metric BMO and parallel path PPO. The purpose of this designation is to correct for any phase shifts in received signal point P. When the phase shift of the carrier wave is 90 degrees, switch 60 switches to its 90 degree input, which accepts parallel path PP1 and branch metric BM1 from arithmetic unit 51. Thus, the information that appears at the output of switch 60 will correspond to branch metric BM1 and parallel path PP1, but by appearing at the output of switch 60, this information will have been redesignated as branch metric BMO and parallel path PP0. Switch 60 supplies its output to register 70. Had the phase shift been 0 degrees, then the information appearing at the output of switch 60 would have corresponded to branch metric BM0 and parallel path PP0 from arithmetic element 50. No redesignation would have occurred in this situation.

Similarly, if the phase shift of the carrier wave is 180 degrees, switch 60 switches to its 180 degree input, which accepts parallel path PP2 and branch metric BM2 from arithmetic unit 52. Thus, the information that appears at the output of switch 60 in this instance corresponds to branch metric BM2 and parallel path PP2, but by appearing at the output of switch 60, this information is redesignated as branch metric BM0 and parallel path PP0. If the phase shift of the carrier wave is 270 degrees, then switch 60 switches to its 270 degree input, which accepts parallel path PP3 and branch metric BM3 from arithmetic unit 53. Thus, the information that appears at the output of switch 60 in this instance corresponds to branch metric BM3 and parallel path PP3, but by appearing at the output of switch 60, this information is redesignated branch metric BM0 and parallel path PP0.

The other switches 61–67 also switch their inputs in the same manner as switch 60, and perform processing that is similar to the processing described with respect to switch 60. Thus, phase shift-corrected branch metrics BM1–BM7 and parallel path identifiers PP1–PP7 are stored in the corresponding registers 71–77.

The phase shift-corrected branch metrics BM0–BM7 stored in registers 70–77 are supplied to the apparatus shown in FIG. 16 which decodes the received information in accordance with a Viterbi decoding algorithm. Branch metrics BM0, BM2, BM4, and BM6 are supplied to arithmetic elements 90–93 (where the designation "ACS" refers to "Add, Compare, Select"). Branch metrics BM1, BM3, BM5, and BM7 are supplied to arithmetic elements 94–97. Arithmetic elements 90–93 calculate state metrics SM0–SM3 (which correspond to input branch metrics BM0–BM3) according to the equations discussed below. Arithmetic element 90, for example, performs the following calculations:

$$SM_{00}=SM0+BM0$$

$$SM_{01}=SM2+BM4$$

$$SM_{02}=SM4+BM2$$

$$SM_{03}=SM6+BM6$$

$$SM0=\min\{SM_{0i}\}(i=0-3)$$

When branch metrics BM0, BM2, BM4, and BM6 are first input to arithmetic element 90, element 90 selects the smallest branch metric, and supplies it as state metric SM0 to register 100, where SM0 is retained. Then, when branch metrics BM0, BM2, BM4, and BM6 are entered, arithmetic element 90 adds the currently entered branch metric BM0 to state metric SM0 which has been retained in register 100, thus calculating $SM_{00}$.

In the same way as in the case of register 100, state metric SM2, SM4, or SM6 is retained in register 102, 104, or 106. Arithmetic element 90 adds state metric SM4, which has been retained in register 104, to the newly entered branch metric BM2, thus calculating $SM_{01}$. Likewise, state metric SM2, which has been retained in register 102, is added to the new branch metric BM4, thus computing $SM_{02}$. And, state metric SM6, which has been retained in register 106, is added to the new branch metric BM6.

Of the state metrics $SM_{00}$–$SM_{03}$ obtained in this way, the smallest one is selected and supplied as new state metric SM0 to register 100, where the metric is stored. This series of operations is repeatedly carried out.

Arithmetic elements 91–93 perform similar processing. State metrics SM1–SM3 are successively updated and held in registers 101–103.

Arithmetic element 94 effects calculations given by $$SM_{40}=SM1+BM1$$

$$SM_{41}=SM3+BM5$$

$$SM_{42}=SM5+BM3$$

$$SM_{43}=SM7+BM7$$

$$SM4=\min\{SM_{4i}\}(i=0-3)$$

When branch metrics BM1, BM3, BM5, and BM7 are first input to arithmetic element 94, element 94 selects the smallest branch metric, and supplies it as state metric SM4 to register 104, where state metric SM4 is retained. Then, when branch metric BM1 is entered, state metric SM1 which has been retained in register 101 is added, thus calculating $SM_{40}$. State metric SM5 which has been retained in register 105 is added to new branch metric BM3, thus calculating $SM_{41}$. State metric SM3 which has been retained in register 103 is added to new branch metric BM5, thus calculating $SM_{42}$. State metric SM7 which has been retained in register 107 is added to new branch metric BM7, thus calculating $SM_{43}$.

The minimum one of state metrics $SM_{40}$–$SM_{43}$ obtained in this way is found and supplied as new state metric SM4 to register 104 and stored there. This series of operations is repeated.

Arithmetic elements 95–97 perform processing similar to the processing performed by arithmetic element 94. State metrics SM5–SM7 are successively held in registers 105–107, so that the stored state metrics are successively updated and held. State metrics SM0–SM7 are then supplied to a circuit for generating angular information, which is described with respect to FIG. 19.

Figure 18:
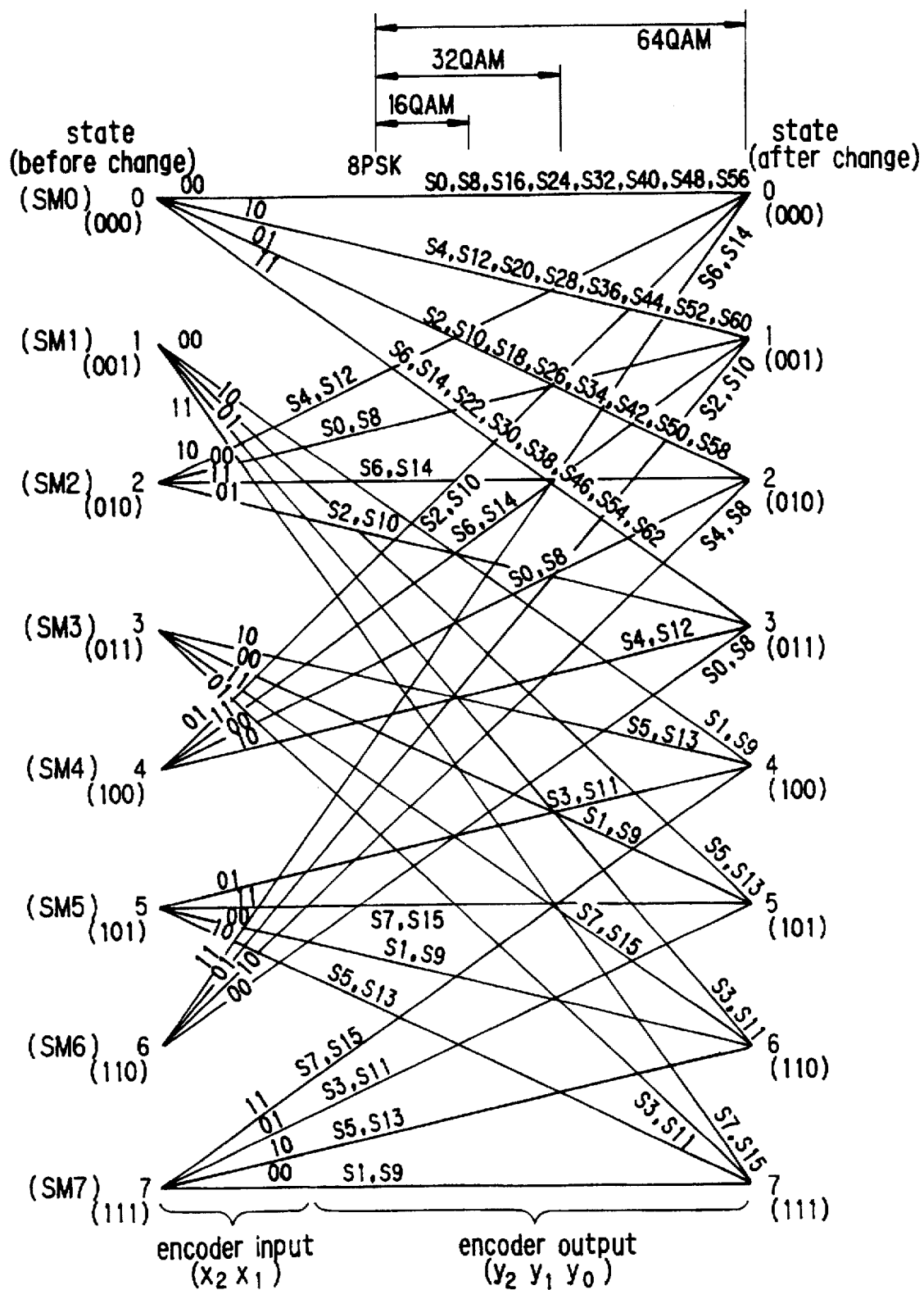
FIG. 18 is a Trellis diagram corresponding to the data illustrated in FIG. 17.

Arithmetic elements 90–97 also generate a plurality of select signals, SEL0–SEL7. Each select signal is indicative of one input (either 0, 2, 4, 6 or 1, 3, 5, 7, as the case may be) of its corresponding arithmetic element. Each of these select signals is supplied to a corresponding path memory (80–87). Each path memory has four inputs, and each of these inputs corresponds to a particular path in the Trellis diagram of FIG. 18. The Trellis diagram is a state diagram that illustrates the manner in which phase corrected information is decoded when such information has been mapped according to the signal point arrangement of FIG. 10. With respect to path memory 80, the select signal SEL0 corresponds to state 0 on the top right hand side of the diagram of FIG. 18. As FIG. 18 illustrates, four lines (or paths) lead to state 0 from the left hand side of the diagram. Starting from the top of the diagram, the first path is labelled 00, and this path corresponds to input 00 of path memory 80. The second path leading to state 0 is labelled 10, and this path corresponds to input 10 of path memory 80. The third path leading to state 0 is labeled 01, and it corresponds to input 01 of path memory 80. The last path leading to state 0 is labeled 11, and it corresponds to input 11 of path memory 80. A similar correspondence exists between the remaining path memories 81–87 in FIG. 16 and states 1–7 in FIG. 18. Selector 110 selects the minimum output of path memories 80–87 which corresponds to decoded data.

Figure 25:
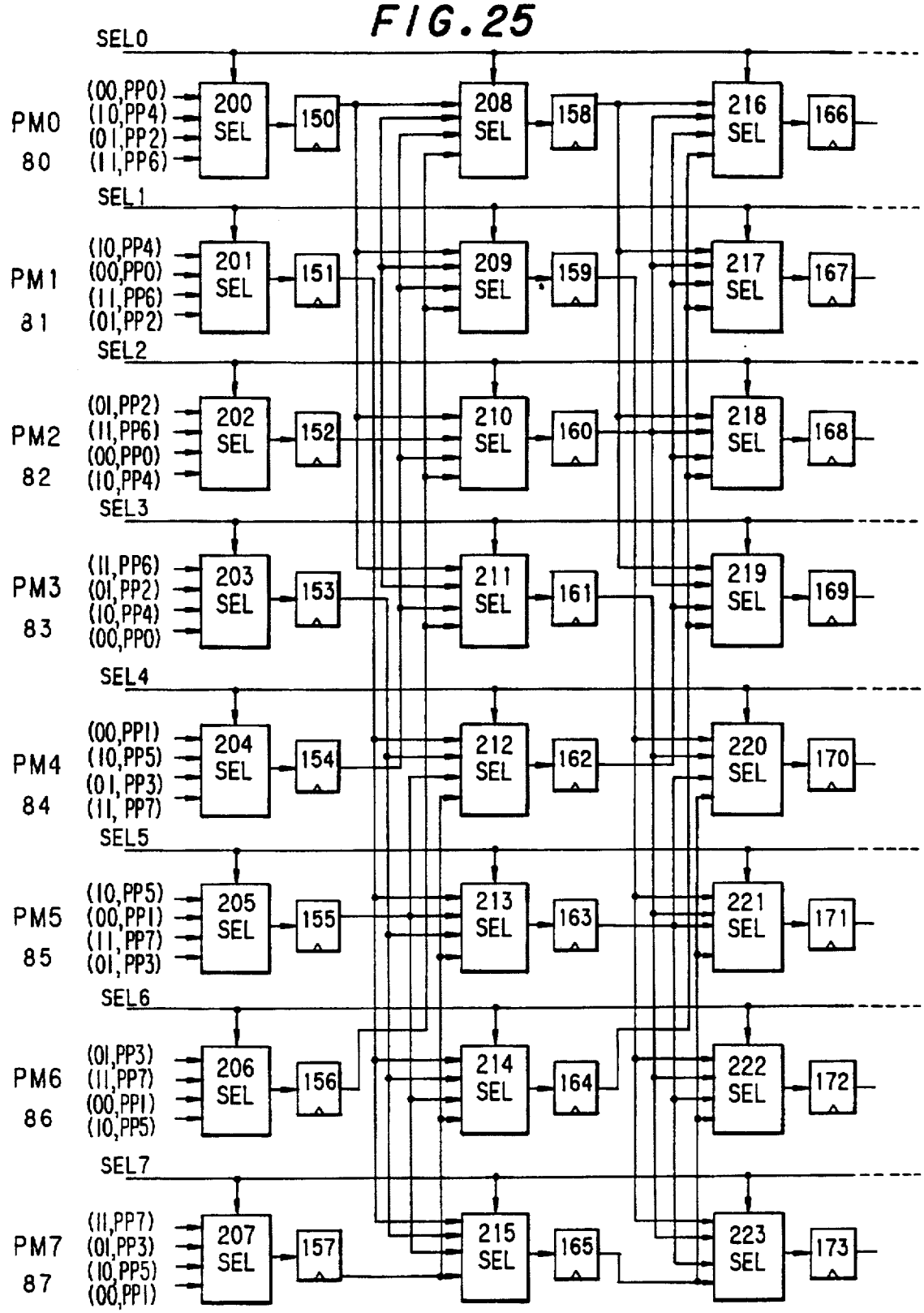
FIG. 25 is a block diagram showing the structure of the path memories used in FIG. 16.

FIG. 25 illustrates a preferred embodiment of path memories 80–87 which implement the state diagrams of FIGS. 17 and 18. With respect to path memory 80, it comprises selectors 200, 208, and 216, and corresponding registers 150, 158, 166. The inputs identified therein are supplied to selector whose output is supplied to register 150 and thence to selectors 208, 209, 210, and 211. Each of selectors 208-211 supplies its respective output to a corresponding one of registers 158, 159, 160, and 161. With respect to path memory 80, select signal SEL0 is supplied to each of selectors 200, 208 and 216 included in path memory 80. It will be appreciated that if more selectors are included in the path memory, the more reliable the decoded data will be. Path memories 81-87 are constructed similarly to path memory 80.

It is seen that 4 bits of output data (y3y2y1y0) are created from 3 bits of input data (x3x2X1) by encoder 2 of FIG. 2. Since the MSB, or x3, of the input data is a parallel path directly sent to the MSB, or y3, of the output data, when input data items x2 and x1 are applied to exclusive-or circuits 14 and 15, the values of data R2, R1, and R0 held in registers 11, 12, and 13 before and after the exclusive-or combination and the values of the output bits y2, y1, and y0 obtained therefrom are as illustrated in FIG. 17. The values illustrated in FIG. 17 are expressed in the Trellis diagram shown in FIG. 18.

In FIG. 18, numerals 0(000)-7(111) of state metrics SM0-SM7 show the states represented by 3 bits of data (R2R1R0), which are produced in registers 11-13 of encoder 2. The values on the left side of FIG. 18 show states before changes (that is, before the operation of EXCLUSIVE-OR gates 14 and 15 in FIG. 2), while the values on the right side show the states after the changes.

Numerals 00-11 at the left side of FIG. 18 indicate the two bits of input data (x2x1). S0, S1, S2, . . . , at the right side of FIG. 18 indicate the signal points of FIG. 10 corresponding to 3 bits of the output data (y2y1y0) produced by encoder 2.

For example, when (R2R1R0) is in the state of 000, if 00 is applied as (x2x1), the (R2R1R0) changes to state 000. In this case, the state does not vary. The output becomes S0 (0000) or S8 (1000). That is, paths corresponding to these signal points S0 and S8 form parallel paths. In the case of S0, the parallel path identifier PP0 shown in FIG. 15 is set to 0 because the MSB of the value of S0(0000) is 0. In the case of S8, PP0 is set to 1 (PP0 =1) because the MSB of the value of S8(1000) is 1.

In this way, of states represented by (R2R1R0), states 0(000)-3(011) make transitions from state 0(000), 2(010), 4(100), or 6(110) and do not make transitions from state 1(001), 3(011), 5(101), or 7(111).

Similarly, states 4(100)-7(111) make transitions from states 1(001), 3(011), 5(101), and 7(111) and do not make transitions from states 0(000), 2(010), 4(100), and 6(110).

If state metrics SM0-SM7 correspond to states 0-7 represented by (R2R1R0), then state metrics SM0-SM3 are affected only by state metrics SM0, SM2, SM4, and SM6 which are not yet changed. State metrics SM4-SM7 are affected only by state metrics SM1, SM3, SM5, and SM7 which are not yet changed. Therefore, only those state metrics which are affected are calculated, and new state metrics are found.

In FIG. 18, states 0-7 correspond to state metrics SM0-SM7, and signal point Si corresponds to branch metric BMi. Therefore, in the path from state 0 to state 0, SM01=SM0+S0=SM0+BM0 In the path from state 2 to state 0, SM02=SM2+S4=SM2+BM4 In the path from state 4 to state 0, SM03=SM4+S2=SM4+BM2 In the path from state 6 to state 0,

SM04=SM6+S6=SM6+BM6

Figure 19:
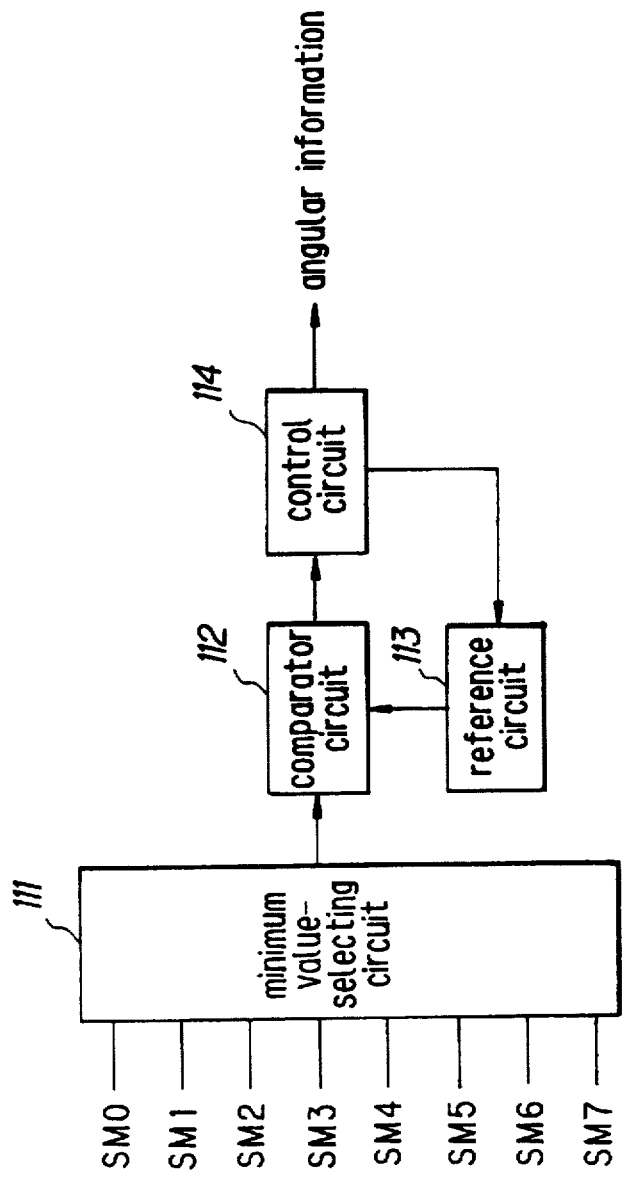
FIG. 19 is a block diagram showing an example of the structure of a circuit for creating angular information.

FIG. 19 shows a circuit for generating the angular information used by switches 60-67 in FIG. 15. Here, state metrics SM0-SM7 produced from registers 100-107 in FIG. 16 are supplied to a minimum value-selecting circuit 111 which selects the minimum one of the applied state metrics SM0-SM7 and supplies the selected state metric to a comparator circuit 112.

Let it be assumed that the switches 60-67 shown in FIG. 15 have been switched to their 20°-inputs. In this case, during a certain period of time, the minimum state metric SM0-SM7 obtained by decoding successively received data is a comparatively small value. On the other hand, if a phase shift of for example, 90 degrees, takes place, state metrics SMi obtained when the switches 60-67 have been switched to their 0°-inputs do not have the correct paths and so the minimum value is relatively large.

The comparator circuit 112 compares the minimum state metric SMi produced from the minimum value-selecting circuit 111 with a reference produced from a reference circuit 113. If the value of the state metric SMi is outside the range of the reference value, a control circuit 114 produces angular information to, for example, switch the switches 60-67 to their 90°-inputs. The foregoing is repeated and if the selected minimum value of the resulting state metrics SMi is larger than the reference value, the control circuit 114 again switches the switches 60-67 to the next inputs. In this way, the inputs of the switches 60-67 are switched to the 0°-, 90°-, 180°-, and 270°-inputs. If the minimum state metric SMi selected by the minimum value-selecting circuit 111 is within the range of the reference, then it follows that the switches 60-67 have been switched to their correct inputs.

As the time required to process input data is increased, the reference value established by the reference circuit 113 increases accordingly. This reference value is controlled by the control circuit 114, as shown in FIG. 19.

Figure 20:
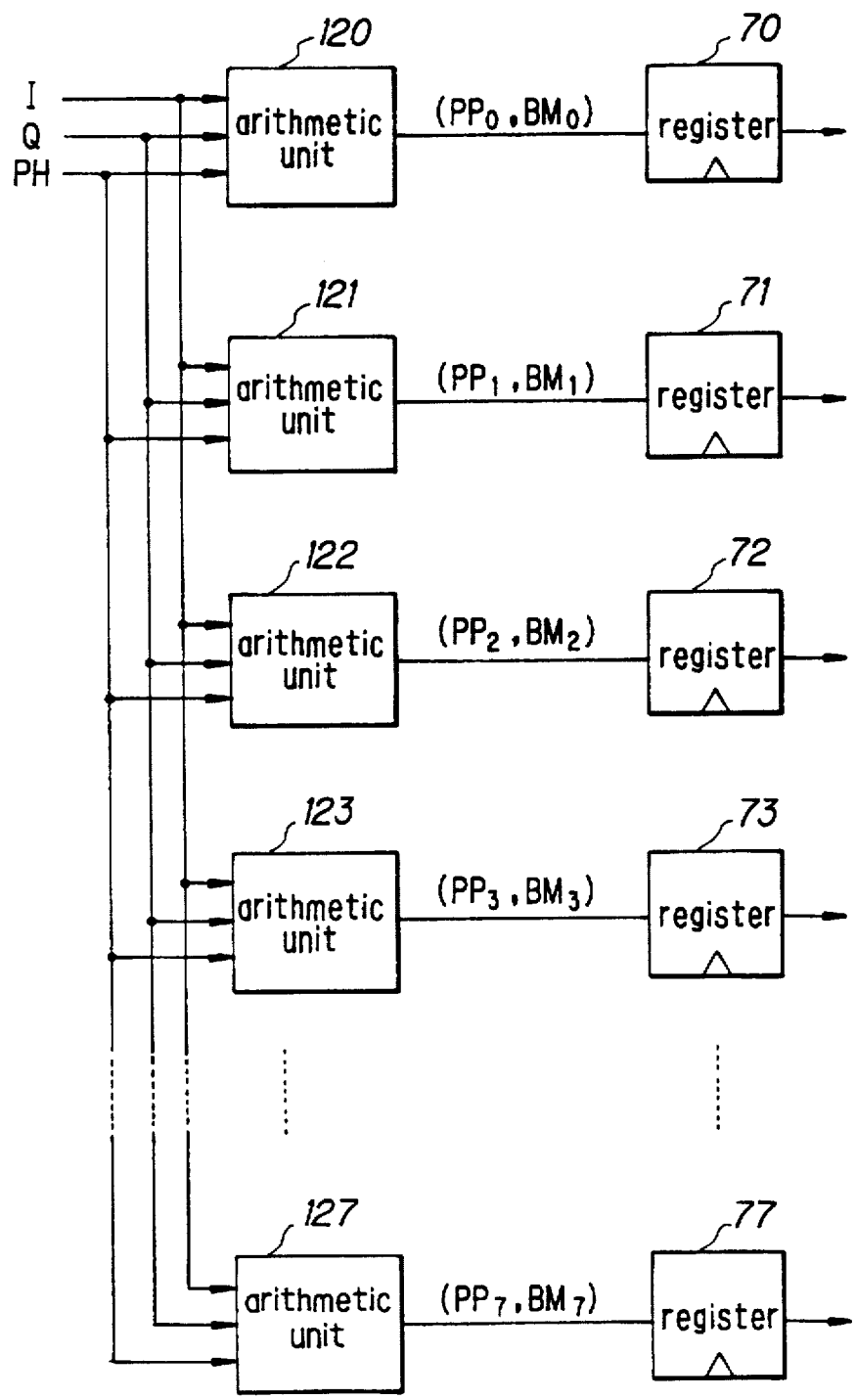
FIG. 20 is a block diagram showing another example of the structure of the decoder with which the novel signal point-detecting method is used.

FIG. 20 shows an alternative embodiment of the circuit shown in FIG. 15. In the example of FIG. 15, the results of the calculations performed by the arithmetic elements 50-57 are selected by the switches 60-67. In FIG. 20, these arithmetic elements are integrated with their respective switches to form arithmetic units 120-127. Accordingly, angular information (PH) produced by the control circuit 114 shown in FIG. 19 is supplied to the arithmetic units 120-127 (each of which consists of, for example, a ROM) together with data I, Q corresponding to the values of the received signal points. The arithmetic units apply branch metrics BMi corresponding to the angular information and parallel path identifiers PPi to respective registers 70-77.

Figure 21:
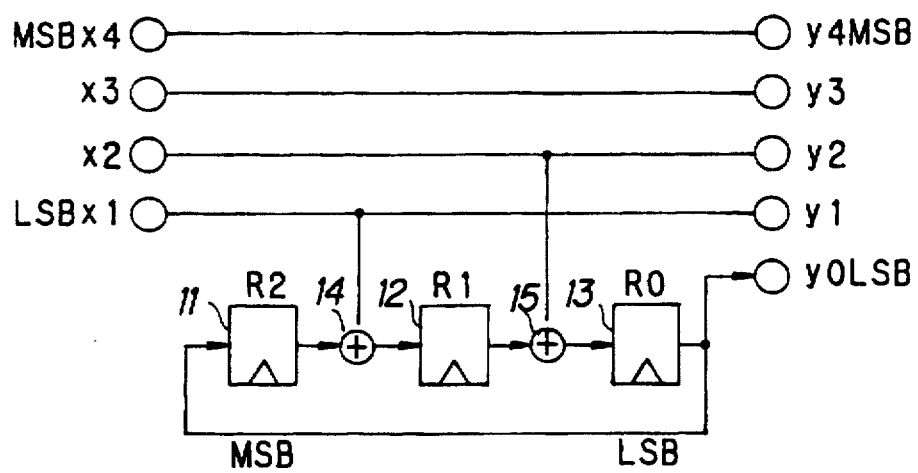
FIG. 21 is a block diagram showing a further example of the structure of the encoder.

FIG. 21 shows another example of encoder 2. This example is similar to the encoder shown in FIG. 2 except that the input data is formed of four bits and the output data is formed of five bits. As shown, the input data consists of 4 bits (x4x3x2x1) and the output data consists of 5 bits (y4y3y2y1y0), wherein x4 is delivered directly as output y4, thus forming an additional parallel path in this embodiment.

In this example, the signal points of each subset are configured with respect to the grids as shown in FIG. 22. Also in this example, four signal points are arranged so that subsets 0 and 1 are symmetrically arranged with respect to the center square of the grid, subsets 1 and 2 are symmetrically arranged with respect to the center square, subsets 2 and 3 are symmetrically arranged with respect to the center square, and subsets 3 and 0 are symmetrically arranged with respect to the center square. The signal points are so constructed that the most significant or upper bits corresponding to the parallel paths of the corresponding signal points agree with each other.

For example, the signal point S8 (01000) of the subset 0 corresponds to the signal point S9 (01001) of the subset 1. The two most significant bits are "01" in both signal points. The signal point S0 (00000) of the subset 0 corresponds to the signal point S1 (00001) of the subset 1, and the two most significant bits in both signal points are "00". The signal point S16 (10000) of the subset 0 corresponds to the signal point S17 (10001) of the subset 1, and the two most significant bits are "10". The signal point S24 (11000) of the subset 0 corresponds to the signal point S25 (11001) of the subset 1 and the two most significant bits are "11".

Likewise, the signal point S1 (00001) of the subset 1 corresponds to the signal point S2 (00010) of the subset 2, and the two most significant bits are "00". The signal point S9 (01001) of the subset 1 corresponds to the signal point S10 (01010) of the subset 2 and the two most significant bits are "01". The signal point S17 (10001) of the subset 1 corresponds to the signal point S18 (10010) of the subset 2 and the two most significant bits are "10". The signal point S25 (11001) of the subset 1 corresponds to the signal point S26 (11010) of the subset 2 and the two most significant bits are "11".

Similar relationships are seen in the signal points between the subsets 2 and 3 and in the signal points between the subsets 3 and 0.

Additionally, the signal points of the subsets 4–7 are mapped in such a way that relations similar to those which exist for subsets 0–3 are retained.

Figure 23:
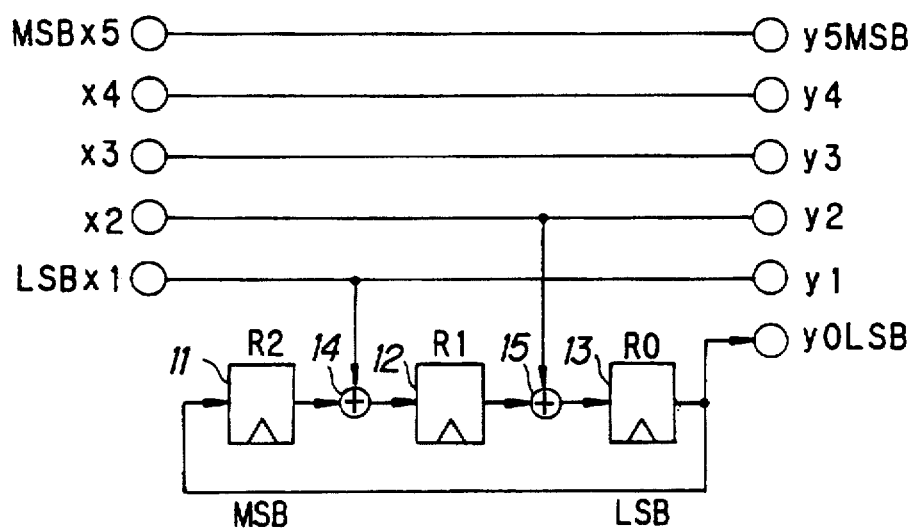
FIG. 23 is a block diagram of still another example of the structure of the encoder.

FIG. 23 shows a further example of encoder 2, similar to the example shown in FIG. 21 except that here, 5 bits of input data (x5x4x3x2x1) are converted into 6 bits of output data (y5y4y3y2y1y0). The MSB, or x5, of the input data is delivered as the MSB, or y5, of output data as it is, thus forming the parallel path.

Figure 24:
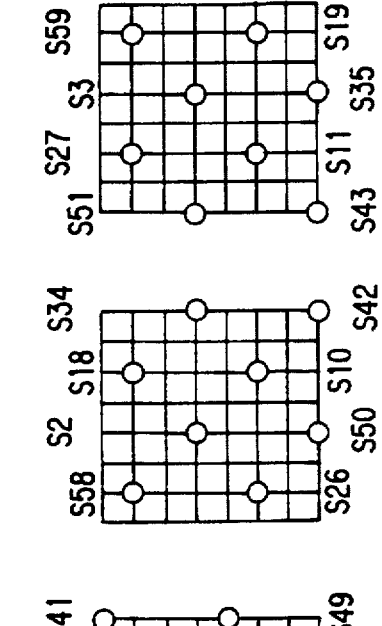
FIG. 24 is a diagram illustrating mapping used where the encoder is constructed as shown in FIG. 23.

FIG. 24 shows an example of mapping when the encoder shown in FIG. 23 is used. It is seen that the signal points of the subsets in FIG. 24 are arranged symmetrically with respect to the center squares of the grids shown in subsets 0–7. Moreover, the signal points are arranged in each subset so that the three most significant bits of a signal point in a subset is the same as the three most significant bits of a corresponding signal point in an adjacent subset.

For simplification, and to avoid unnecessary duplicative explanation, only the relation between the subsets 0 and 1 is described further. The signal point S0 (000000) of the subset 0 corresponds to the signal point S1 (000001) of the subset 1, and it is seen that the three most significant bits of both signal points are "000". The signal point S8 (001000) of the subset 0 corresponds to the signal point S9 (001001) of the subset 1, and the three most significant bits of both signal points are "001". The signal point S16 (010000) of the subset 0 corresponds to the signal point S17 (010001) of the subset 1, and the three most significant bits of both signal points are "010". The signal point S24 (011000) of the subset 0 corresponds to the signal point S25 (011001) of the subset 1, and the three most significant bits of both signal points are "011". The signal point S32 (100000) of the subset 0 corresponds to the signal point S49 (100001) of the subset 1, and the three most significant bits of both signal points are "100". The signal point S40 (101000) of the subset 0 corresponds to the signal point S41 (101001) of the subset 1, and the three most significant bits of both signal points are "101". The signal point S48 (110000) of the subset 0 corresponds to the signal point S33 (110001) of the subset 1, and the three most significant bits of both signal points are "110". The signal point S56 (111000) of the subset 0 corresponds to the signal point S57 (111001) of the subset 1, and the three most significant bits of both signal points are "111".

In this example, the three lower bits of the signal points in a subset represent the number of that subset. It will be appreciated that the advantages derived from the examples shown in FIGS. 22 and 24, are the same as those derived from the example described in conjunction with FIG. 10.

As described thus far, in the signal point-mapping method of the present invention, the most significant or upper bits corresponding to the parallel path of the first subset rotated through an angle Φ corresponds to the second subset. Therefore, even if there is uncertainty of the angle Φ, an identifier corresponding to the parallel path can be quickly and accordingly obtained.

Moreover, according to the present invention, desired ones of sets of the most significant or upper bits of signal points and branch metrics are selected according to the phase rotation of the carrier wave. Therefore, the signal points can be decoded quickly and accurately even if the carrier has undergone phase rotation.

While the present invention has been particularly shown and described with reference to the preferred embodiments, it will be readily appreciated by those of ordinary skill in the art that various changes and modifications may be made without departing from the spirit and scope of the invention. It is intended that the appended claims be interpreted as covering the embodiments described herein and all equivalents thereto.

What is claimed:

1. An apparatus for decoding a digital signal transmitted over a transmission path as a plurality of signal points, said plurality of signal points being divided into a plurality of subsets, said plurality of subsets comprising at least two groups, each group having at least four subsets, each subset having at least two signal points arranged symmetrically with respect to a reference point, wherein the signal points of a first subset correspond to the signal points of a second subset when said first subset is rotated through an angle φ about said reference point, comprising:

means for receiving said digital signal;

means for demodulating said signal to obtain coordinate components thereof; and decoder means for calculating a distance between the coordinate components of the demodulated digital signal and each of signal points in said second subset, said decoder means decoding said digital signal to obtain said first subset in accordance with the calculated distance such that the most significant bit of each of said signal points of said second subset is equal to the most significant bit of each of said corresponding signal points of said first subset after said first subset has been rotated through said angle φ.

2. The apparatus of claim 1, wherein said means for demodulating includes a QAM demodulator.

3. The apparatus of claim 2, wherein said decoder means is operable to decode said digital signal in accordance with a Viterbi decoding algorithm.

4. The apparatus of claim 3, wherein said decoder means is operable to calculate branch metrics as a function of said calculated distances and to calculate state metrics as a cumulative sum of said branch metrics, said decoder means selecting said decoded signal in accordance with said branch metrics and said state metrics.

5. The apparatus of claim 4, wherein said decoder means comprises:

means for selecting in each said subset a signal point having a minimum distance to said coordinate components of said digital signal and to output said minimum distance as branch metrics and to output the most significant bit of said selected signal point as a parallel path signal;

add-compare-select means for adding said branch metrics to form a cumulative sum, for comparing the sums resulting from said adding, for selecting a path as a function of said comparison, for producing a path selection signal designating said selected path, and for producing a state metric as a function of said comparison;

means for storing said state metric as said cumulative sum of branch metrics; and path memory means including a plurality of path memory cells for selecting a decoded word and said parallel path signal, for storing the decoded word and said parallel path signal and for shifting said decoded word and said parallel path signal, as a function of said path selection signal.

6. The apparatus of claim 4, further comprising:

means for correcting a phase shift of said branch metric and said parallel path signal; and wherein said decoder means decodes said digital signal in accordance with said phase shift corrected parallel path and said phase shift corrected branch metric.

7. The apparatus of claim 6, wherein said means for correcting said phase shift comprises:

means for detecting angular information from said branch metrics indicating whether said digital signal includes a phase shift; and means for selecting a phase shift corrected branch metric and a phase shift corrected parallel path signal in accordance with said angular-information.

8. The apparatus of claim 7, wherein said means for detecting said angular information comprises:

means for selecting a minimum state metric from a plurality of state metrics;

means for comparing said selected minimum state metric with a predetermined reference value to produce a comparison result; and means for producing said angular information in accordance with said comparison result.

9. The apparatus of claim 1, wherein said angle $\Phi$ is 90 degrees in a clockwise direction.

10. A method of decoding a digital signal received as a plurality of signal points, said plurality of signal points being divided into a plurality of subsets, said plurality of subsets comprising at least two groups, each group having at least four subsets, each subset having at least two signal points arranged symmetrically with respect to a reference point, wherein the signal points of a first subset correspond to the signal points of a second subset when said first subset is rotated through an angle $\phi$ about said reference point, comprising the steps of:

demodulating said received digital signal to obtain coordinate components thereof;

calculating a distance between the coordinate components of the demodulated digital signal and each of the signal points in said second subset; and decoding said digital signal to obtain said first subset in accordance with the calculated distance such that the most significant bit of each of said signal points of said second subset is equal to the most significant bit of each of said corresponding signal points of said first subset after said first subset has been rotated through said angle $\Phi$.

* * * * *